United States Patent [19]

Eytcheson et al.

[11] Patent Number: 5,539,254

[45] Date of Patent: * Jul. 23, 1996

[54] SUBSTRATE SUBASSEMBLY FOR A TRANSISTOR SWITCH MODULE

[75] Inventors: Charles T. Eytcheson, Kokomo; Donald E. Lake, deceased, late of Rochester; by Juanita Lake, administratix, Rochester; Aiman I. Alhoussami, Indianapolis; John D. Tagle, West Lafayette; Timothy D. Martin, Kokomo; Lisa A. Viduya, Carmel; Frank D. Lachenmaier, Kokomo, all of Ind.

[73] Assignee: Delco Electronics Corp., Kokomo, Ind.

[ * ] Notice: The portion of the term of this patent subsequent to Mar. 14, 2012, has been disclaimed.

[21] Appl. No.: 208,244

[22] Filed: Mar. 9, 1994

[51] Int. Cl.⁶ ............ H01L 23/057; H01L 23/373; H01L 25/065

[52] U.S. Cl. ............ 257/691; 257/705; 257/706; 257/713; 257/724

[58] Field of Search ............ 257/723, 724, 257/703, 705, 584, 587, 690, 691, 698, 781, 536, 700, 701, 762, 706, 713

[56] References Cited

U.S. PATENT DOCUMENTS

| | | | |
|---|---|---|---|
| 3,714,709 | 2/1973 | Liederbach | 29/626 |
| 4,538,170 | 8/1985 | Yerman | 357/80 |
| 4,694,322 | 9/1987 | Sakurai et al. | 357/74 |
| 4,766,481 | 8/1988 | Gobrecht et al. | 257/703 |
| 5,297,001 | 3/1994 | Sterung | 257/717 |
| 5,311,043 | 5/1994 | Stockmeier | 257/795 |
| 5,347,160 | 9/1994 | Sutrina | 257/690 |
| 5,408,128 | 4/1995 | Furnival | 257/690 |

OTHER PUBLICATIONS

Power Package Purges Wire Bonds & Their Inductance (Electronic Design Jul. 22, 1993 No. 15 p. 35).

*Primary Examiner*—Peter Toby Brown
*Attorney, Agent, or Firm*—Mark A. Navarre

[57] ABSTRACT

A substrate subassembly for a high power module, and methods involving the same. The substrate subassembly contains only one switching transistor and has at least one integral short terminal lead tab. The substrate subassemblies can be pretested at significant operating current, to obtain enhanced characterization and matching of mounted switching transistors. Trimmable gate lead resistances can be incorporated in the substrate subassemblies. Enhanced compositional, geometrical and electrical module symmetry is available. New module structures and method are afforded.

9 Claims, 13 Drawing Sheets

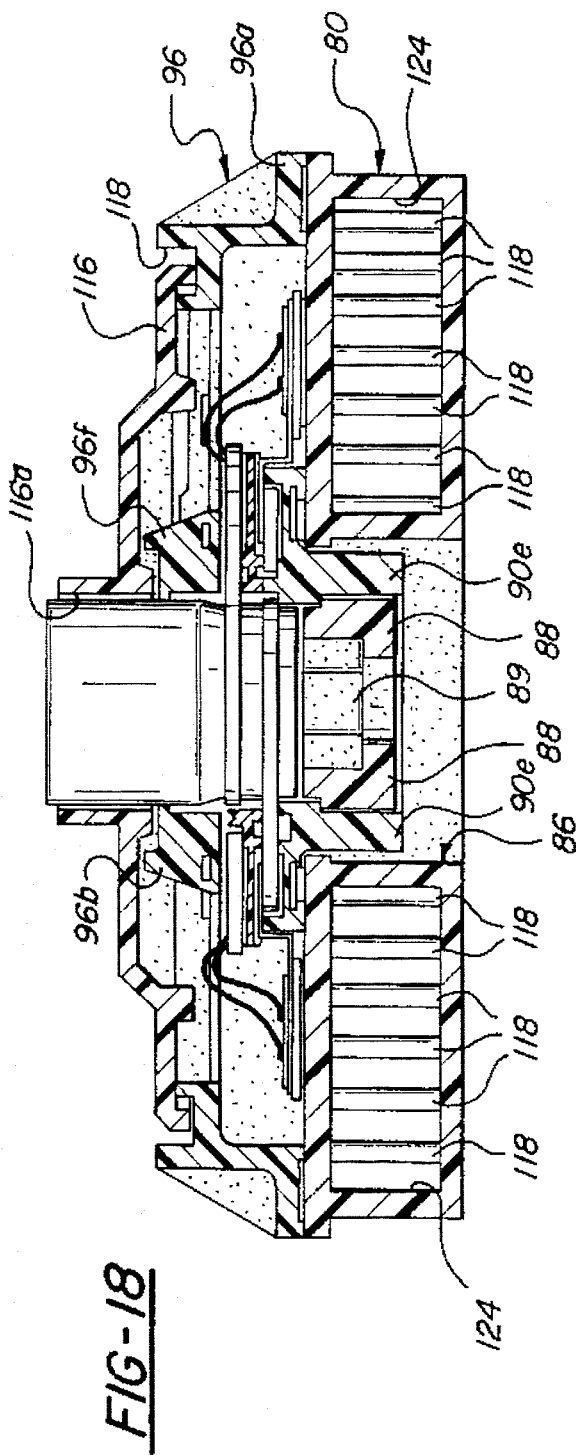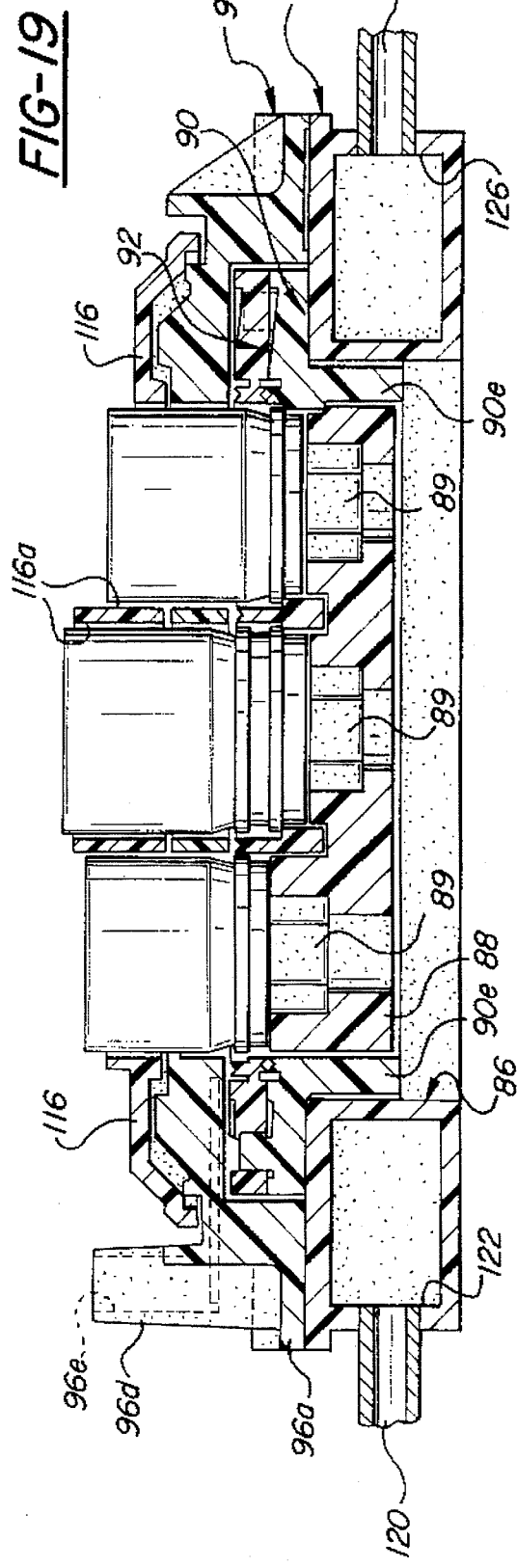

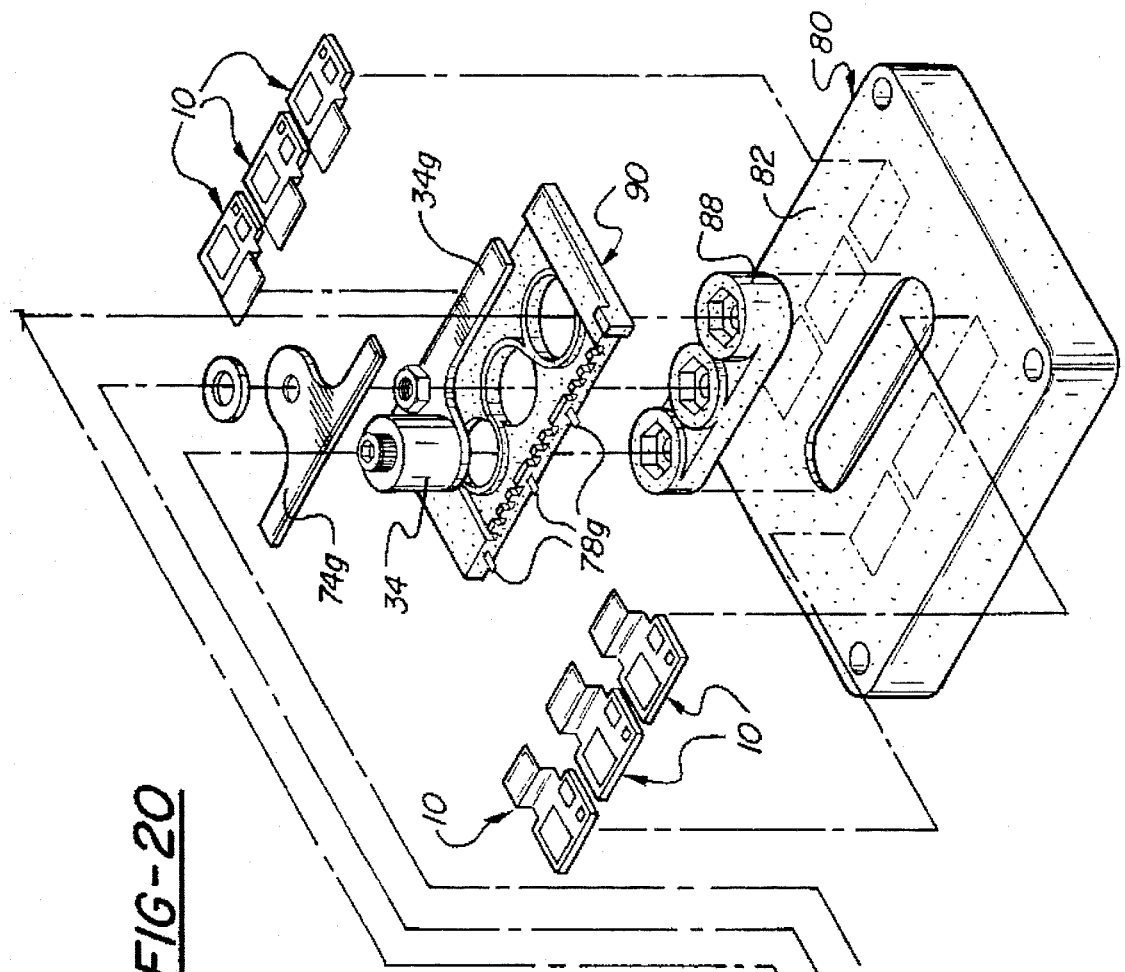
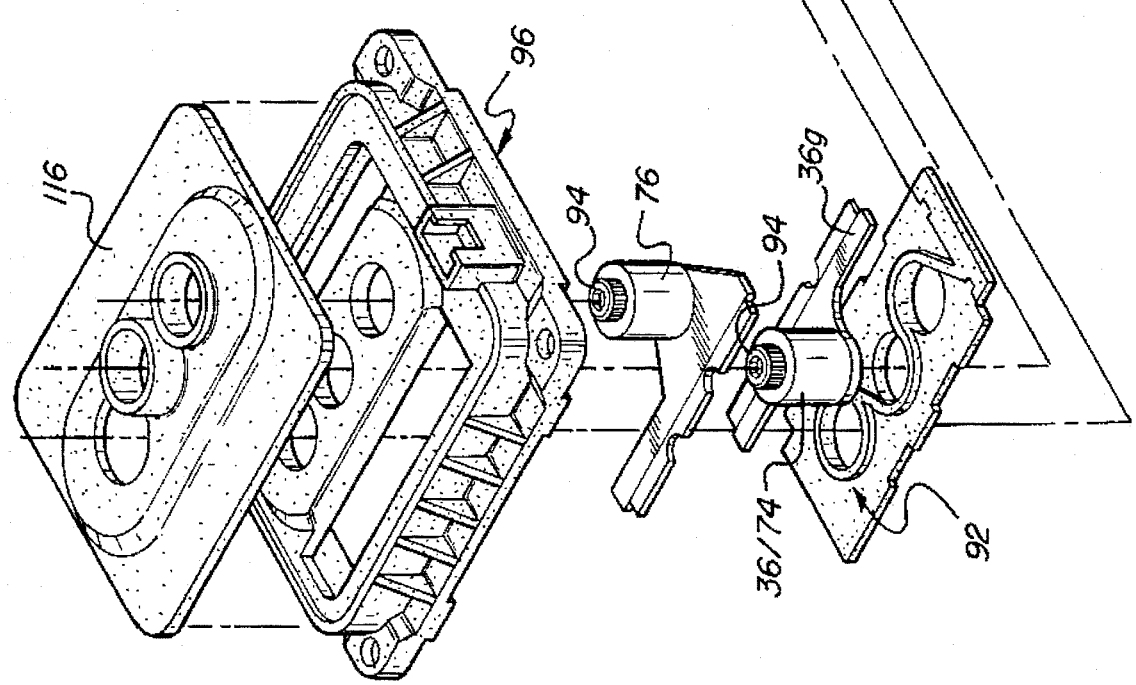
FIG-20

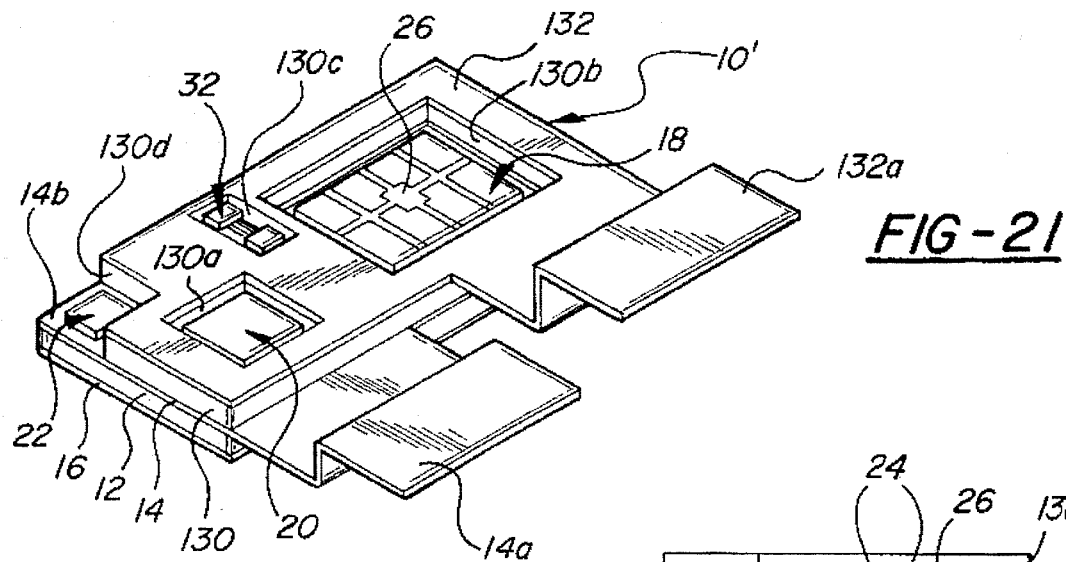
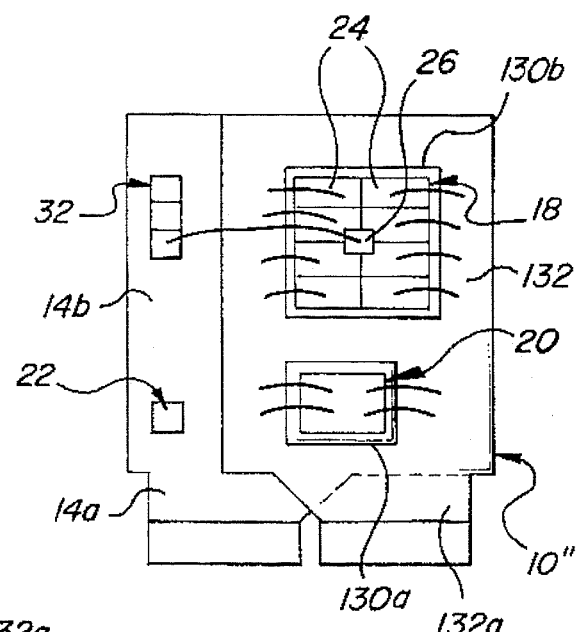
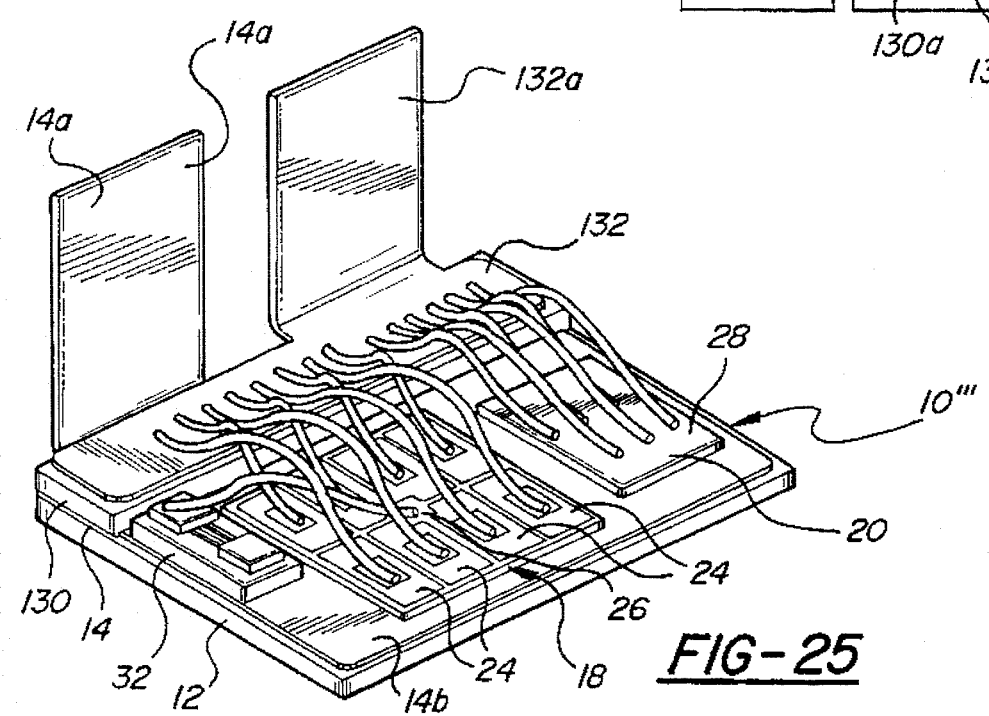

SUBSTRATE SUBASSEMBLY FOR A TRANSISTOR SWITCH MODULE

RELATED PATENT APPLICATIONS

This patent application is related to the following patent applications, the first three of which are assigned to the assignee of this invention and incorporated herein by reference:

U.S. patent application Ser. No. 08/117,924, filed Sep. 7, 1993, and entitled "High Power Semiconductor Switch Module";

U.S. patent application Ser. No. 08/116,793, filed Sep. 7, 1993 and entitled "Coaxial Switch Module";

U.S. Pat. No. 5,444,295, issued Aug. 22, 1995, and entitled "Linear Dual Switch Module";

U.S. patent application Ser. No. 08/233,572, filed Apr. 26, 1994; and entitled "Electron and Laser Beam Welding Method and Apparatus"; and U.S. patent application Ser. No. 08/278,199, filed Jul. 21, 1994 and entitled "Triaxial Double Switch Module".

FIELD OF THE INVENTION

This invention relates to packaging of a high voltage/high current/high frequency semiconductor switching device. More specifically, this invention relates to substrate subassemblies for a power module containing a plurality of electrically paralleled high voltage and high current semiconductor switching devices that are operated at high frequency. It also relates to methods of making such substrate subassemblies and to methods of making modules that incorporate such substrate subassemblies.

BACKGROUND OF THE INVENTION

Insulated gate bipolar transistors (IGBTs) are an extremely attractive semiconductor device for power applications. They are more attractive than a power-type insulated gate field effect transistor (IGFET), which is popularly referred to as a MOSFET. An IGBT can handle both high voltages and high currents with small die size and with relatively low "on" resistance. In addition, an IGBT can be switched rapidly, making IGBTs potentially useful as switches in a three phase inverter for a high power alternating current motor application.

On the other hand, the high current density capability and low "on" resistance of the IGBT also present new challenges. The possibility of device failure is aggravated when the IGBT is handling high power. By high power, we mean current densities above about 135 amps per square centimeter of active chip area, at hundreds of volts. By high frequency switching we mean on/off frequencies above about 18 kilohertz, as for example 30 kilohertz. As might be expected, significant impedance, material and mechanical problems are encountered in handling such power at high frequencies and low resistances. This is especially true for a high power/high frequency module, in which several such IGBTs are electrically paralleled. Heretofore, the foregoing problems have been so difficult that not many high power/high frequency IGBT modules have been commercially manufactured. Those that were made thus far, have been made in relatively low volume, where each module could be individually specially crafted.

In this specification, we describe distinctive substrate subassemblies that can be used for both linear-type and circular-type high frequency/high power modules that are capable of being manufactured on a commercial production basis. By commercial production basis, we mean production volumes such as are used in the automotive industry. Moreover, in describing this invention, we describe the principles by which high quality and high performance modules can be more effectively manufactured on a commercial production basis.

We describe substrate subassemblies, and methods of manufacture, testing and assembly involving such substrate subassemblies, for high power/high switching frequency IGBT modules. Use of these substrate subassemblies and methods, permit economic manufacture of high quality, high performance and high durability power modules, of even insulated gate bipolar transistors (IGBTs), at automotive-type volumes.

OBJECTS AND SUMMARY OF THE INVENTION

Principal objects of this invention are to provide substrates and substrate subassemblies for modules, and modules containing such substrates and substrate subassemblies, that can handle high power electrical currents at high frequencies.

Further objects of this invention are to provide improved testing and assembly techniques for substrate subassemblies, and for high power and/or high frequency modules containing such substrate subassemblies.

These and other objects of the invention are achieved in distinctive substrate constructions and substrate subassemblies that have an active switching device. The substrate subassemblies can be reproduced with a high degree of consistency, and to the extent differences result, the substrate subassemblies can be effectively tested and sorted into very closely matched groups before assembling them into a module.

Accordingly, one can more easily obtain a high degree of electrical symmetry among switching transistors grouped in a module, including a substantial portion of their electrical connections to module terminal members. Still further, the preferred substrate subassemblies of this invention permit electrical leads from the switching transistors to the terminal leads to be quite short, which reduces parasitic impedance effects within the module.

The substrate subassemblies of this invention can be used in a single switch module having input and output terminals that are essentially concentric. The terminals have overlapping integral circumferential flanges. In such a module, a plurality of our substrate subassemblies are symmetrically circumferentially arrayed around said flanges, in close radial proximity to said flanges.

In a dual switch embodiment, input and output terminals are two pairs of overlapping flat plate-like conductors. Each plate in each pair of overlapped plates has a linear edge generally registered with the other plate edge of the pair. The generally registered edges of one terminal pair are laterally disposed from, and generally parallel to, the generally registered edges of the other pair. A first parallel row of our substrate subassemblies, preferably equally spaced, is disposed close to the one pair of generally registered edges. A second parallel row of our substrate subassemblies, preferably equally spaced, is disposed close to the other pair of generally registered edges. A parallel row of input/output terminals is disposed generally mid-way between the spaced and parallel edges of the two plate pairs. A portion of each plate extends under only the one terminal to which it is connected.

BRIEF DESCRIPTION OF THE DRAWINGS

FIG. 8 shows a plan interior view of the module of FIG. 7 is a later stage of assembly that includes the outer coaxial terminal, the housing side walls, and filamentary wire connectors.

FIG. 18 shows a central sectional view through the width of the module of FIG. 17 after a housing cover was added.

FIG. 19 shows a central sectional view through the length of the module of FIG. 17 after a housing cover was added.

FIG. 20 shows an exploded perspective view of the linear type duel switch module shown in FIGS. 14–20.

FIG. 21 shows a perspective view of an improved substrate subassembly made in accordance with this invention but prior to making intra-connecting "wire bonds".

FIG. 24 shows a top plan view of a modification of the improved substrate subassembly shown in FIG. 21.

FIG. 25 shows a perspective view of still another modification of the substrate subassembly shown in FIG. 21 but after intra-connecting "wire bonds" have been made.

DESCRIPTION OF THE PREFERRED EMBODIMENTS OVERVIEW DESCRIPTION

Figure 1:
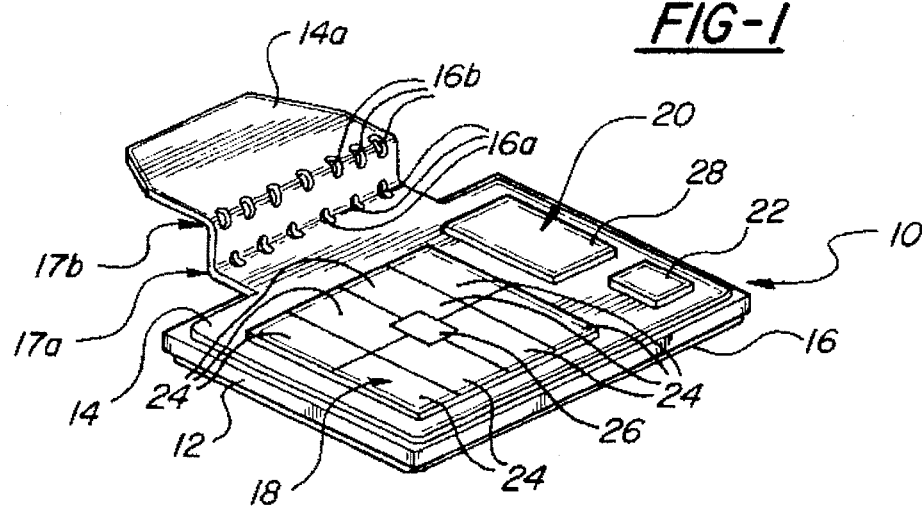
FIG. 1 shows a perspective view of a switching transistor substrate subassembly used in a module of this invention.

The substrates and substrate subassemblies of this invention permit important chemical, mechanical and electrical considerations to be combined in a very special way to obtain a high power/high frequency switch of low inductance. This special interdependency is not believed to be readily apparent, or understood, merely from a simple description of the substrate or the substrate subassembly alone. The function and interdependency of the substrates and substrate subassemblies to the whole module which they comprise have to be described as well.

Various embodiments of the substrates and substrate subassemblies for two complex switch modules are hereinafter described. To avoid repetition, and to make their features and operation more readily understandable, important generic aspects of them shall be described first.

In its preferred embodiment, this invention involves distinctive substrates, distinctive substrate subassemblies, and methods involving semiconductor modules for handling high power electrical currents at high frequencies. The methods include the assembly and testing of such substrate subassemblies and also of modules. This invention facilitates manufacture of semiconductor modules with one or more active switching devices, with the modules exhibiting a high degree of compositional, geometrical, and electrical symmetry. In addition, electrical leads between any power device in the module and input and output terminals for the module are kept extremely short, to reduce parasitic impedance effects in the module.

Input and output conductors for any given semiconductor device of a substrate subassembly are readily tailored to have a similar impedance. Also, if the module has multiple active devices that are electrically in parallel, all devices can be made to be highly matched, even after device chip mount and at least part of significant chip interconnection has been made. Input and output connections can easily be consistently made in a uniform way. This insures equal, i.e., uniform, impedance among all input leads and all output leads, respectively, and a similarity in impedance between input and output leads. Such uniformity and similarity in input and output leads of the substrate subassemblies play an important role in obtaining compositional and geometrical symmetry in a switching transistor module. Input and output conductors in a module usually will each have multiple parts. For example, there may be a special external portion adapted for special connection to an external bus, an intermediate portion adapted to facilitate connection to a semiconductor switching device, and an inner portion that actually makes the connection. The latter part could be one or more filamentary wires, or contact bumps or other soldered connection that interconnects one or more selected regions of a semiconductor chip with an intermediate portion of a particular conductor. Hence, we construe the bonded filamentary wire or soldered connection to be an inner end part of a module conductor. Compositional and geometrical symmetry is desired among all corresponding parts of each conductor type in the module, and to the extent similarity is practical, between types of conductors in the module.

This invention recognizes that if at least some of the inner and intermediate connections could be made as part of a subassembly, simple and reproducible short interconnections can be emphasized. In addition, the resulting products can be tested and matched before more value is added by assembly into a working module. Substrate subassemblies contemplated herein would thus have inner, and at least part of intermediate, module conductors made in a very similar and reproducible way. Moreover, such substrate subassemblies can be tested at a significant proportion of the power level they will handle in the module. However, such testing can be readily done prior to actually incorporating the substrate subassembly in the module. We refer to this as pre-testing. The substrate subassemblies can then be sorted into performance categories before mount in the module. Not only can rejects be identified early, but better matching of performance levels is obtained in any given module. Eliminating rejects early obviously reduces manufacturing cost. However, a product improvement also results. Matching the individual performance levels of chips, allows more chips in the module to operate closer to their maximum performance level and/or improves durability of module operation. Making the individual substrate subassemblies as similar as is practical also helps provide compositional and geometric uniformity in the module in which the substrate subassemblies are used. Compositional and geometrical symmetry in input and output conductors, provides uniformity in current flow to and from all paralleled devices in the module. This, of course, also requires that the switching transistors all be matched well in their performance as mounted, and that they all receive essentially the same control voltage. The substrate subassembly concept of this invention permits easier acquisition of such similarities. It also makes it economically practical to use beryllium oxide as a substrate material in large modules, and even allows the beryllium oxide thickness to be increased enough to reduce parasitic capacitance effects in the resultant module.

The benefit of compositional and geometrical symmetry in input and output conductors is uniformity in input/output current flow among switching devices in the module. Such similarity is not only important from a module durability standpoint. It is also important from a module impedance standpoint. If input and output current is matched and input and output conductors are closely spaced, conductor inductance cancellation can be achieved. Aspects of this are claimed in the above-mentioned U.S. patent applications Ser. Nos. 08/117,294, 08/116,793, and in U.S. No. 5,444, 295.

The last-mentioned patent applications also describe and claim a further extension of geometrical symmetry, which extension adds a second part to electrical symmetry. As mentioned electrical symmetry is important to this invention and to making modules using this invention. The shape and size of the input and output conductors, at least in their intermediate portions, should be closely related. Hopefully, they are similar, or at least complementary enough to allow at least these portions to be disposed close to one another. The type of close disposition we have in mind is one in which the parts fit together or nest together, with a dielectric layer (that is as thin as is practical) spacing them apart. If the conductors are linear, we at least want them parallel and non-contiguously closely spaced. When the completed module is operated, such disposed, i.e., fitted or nested, portions of the input and output conductors should have an electrical current flow that is substantially parallel but opposite in direction. Outer portions can be so disposed also, as for example in concentric terminals. In concentric terminals one might say that the respective configurations are the same or similar. Others might say that such configurations are only complementary. In any event, the configurations are such as to provide another aspect of geometrical symmetry, which can be referred to as one of close parallel proximity.

In the concentric terminal embodiment of this invention shown in FIGS. 6–13 of the drawing, a single element forms the outer and intermediate portions of the input and output connections to all the devices in the module. A separate concentric element is used for each of the input and output, of course. Such a construction is advantageous in its simplicity and manufacturing cost. Nesting of the concentric terminal portions is simple but effective. Also, it is statistically quite durable because of its simplicity. Further, care must be taken to insure that all chip-to-element electrical connections are symmetrical in placement and type, to preserve impedance uniformity between the point of external connection to the terminal and the chip surface. This will probably require circumferential symmetrical disposition of module chips, i.e., substrate subassemblies, around the concentric input and output conductor elements.

These extensions of geometric symmetry provide a second aspect of electrical symmetry as well. As hereinbefore indicated, when the input and output conductor portions are placed in close parallel proximity, current flow in those portions is parallel but opposite in direction. The close proximity of the opposed current flows, allows the inductance of one current flow to at least partially negate, and even substantially cancel, inductance of the other current flow. Substantial reductions in inductance have been achieved using this effect. This inductance cancellation provides a second important part of electrical symmetry contemplated in this disclosure. As mentioned above, in this invention inductance cancellation is even applied to the substrate subassembly itself.

It is recognized that providing substantial close parallel proximity in input and output connections to a given semiconductor chip is difficult. This is because heretofore at least one of the connections was a multiplicity of filamentary wires, each of which wires formed an arch between its ends. The other connection could have been a linear or rectilinear metal or metallized ceramic element soldered to the backside of the chip. One should at least make the input and output connections to the chip parallel in one plane, as for example having an input bonding wire oriented to extend in the same direction as an output tab or strip. In its most preferred form, our substrate has two dielectric layers and three copper layers. The two dielectric layers space apart the three copper foil layers, for a total of five layers. Our five layer substrate 10' is shown in FIGS. 22–25 of the drawing. In our five layer substrate 10', the top copper layer 132 has an over hanging tab 132a, analogous to tab 14a in the middle copper layer, to facilitate testing and connection to an input terminal member.

In a subassembly made with the five layer substrate 10', an even greater portion of the interior input and output connections are parallel and in close proximity. Hence, inductance cancellation is improved. More, will be hereinafter said about the five layer substrate subassembly 10'. Regardless, any portions of the chip-to-conductor connections that cannot be made closely parallel should be made as short as is practical. This would favor use of contact bumps for the chip-to-conductor connection if a practical way of using them in such an assembly can be found. It also favors orienting "wire bond" chip-to-substrate interconnects parallel to the output current flow in our five layer substrate subassembly 10'. However, complete data confirming the importance of this orientation has not yet been analyzed.

Reference is now made to a third important aspect of electrical symmetry that must be observed in a module that incorporates our invention. This third important aspect involves device matching. All of the transistors and soft fast diodes (SFDs) used in our module will have been tested and sorted prior to having been mounted on a substrate of our invention. That much is not unusual. In our invention, only matched transistors and diodes are used in our substrate subassembly, and only matched subassemblies are used to make a module. Not only that, only matched transistor/diode pairs on the substrate subassemblies are used. More specifically, the switching transistor chip and the SFD chip are initially paired, based on the individual testing of these chips. Moreover, a number of such pre-tested chips are combined to make a multiplicity of presumably similar pairs. However, in this invention, the chips are tested again, as a pair mounted on its own separate and discrete substrate, such as the substrate subassembly 10 of FIG. 1.

This invention recognizes that the performance characteristics of a power semiconductor device chip can vary after mount. Chips matched before mount, therefor, do not necessarily match after mount. This invention permits separate testing of individual switching transistor/SFD pairs after mount. This, in turn, permits another level of sorting and matching, and of discarding or repairing, before more value is added.

Further, the completed substrate subassembly can be temporarily mounted on a heat sink and cooled at a predetermined rate during testing. Such testing can then be done at increased currents, which permits one to achieve a more representative prediction, as how the pair will actually perform at full current levels. This permits a still another level of sorting, and matching of performance levels.

Still further, our five layer substrate subassembly 10' does not require input or output current to be supplied by probes. It can be supplied by clamping onto tabs of the top and middle copper foil layers in our substrate. Accordingly, more current can readily be supplied to the switching transistor chip. With proper cooling, full input current can be supplied to our five layer substrate subassembly 10'. This permits performance characterization at actual operating current levels. Because performance is actually tested, not predicted from extrapolations of tests at lower power levels, performance sorting can be more accurate. Thus, one achieves a still higher level of sorting, more importantly, a higher level of switching transistor matching.

Because of this still higher level of sorting, it is less likely that any one switching transistor will tend to "hog" current. This improves reliability of the resultant module and/or allows the module to be operated at a higher performance level. Further, if all the switching transistors are similar in their maximum performance rating as mounted, the closer all of them can be allowed to operate to their individual maximum current level. In a sense, better matching allows greater average utilization of chip power handling potentials. The result is that fewer chips may be needed to handle a given amount of current. It could even mean as much as one less chip per switch, or per module.

As indicated above, matching operating characteristics is important from a durability or reliability standpoint too. If the impedance of one switching transistor is significantly less than that of other paralleled switching transistors, that one switching transistor tends to hog more and more current, until switching transistor failure. Such action can occur very rapidly. For this reason, kelvin connections are desired in the module. They can rapidly detect any undesirable change in impedance, and activate module shutdown before catastrophic failure of the module.

Analogously, if the switching transistors in a group are not matched in their maximum current level ratings, all of the group have to be operated at a level compatible with the weakest of the group. In other words, one transistor of a lesser rating in the group can cause all the other transistors to be operated at power levels that are less than their potential. Analogously, especially if the differently performing chips cannot be identified after mount, the whole module may have to be de-rated to reduce the statistical likelihood of field failures.

There is a supplemental facet to the third aspect of electrical symmetry. The supplemental facet is that the matched devices should have matched cooling. Matched cooling is important because a semiconductor device generates heat during operation. If the heat is not removed, the device will increase in temperature. If it increases in temperature, its operating impedance is reduced. With less impedance, it attracts more than its share of current. The higher current, in turn, generates still more heat, which can cause an avalanche effect to catastrophic device failure. By matched cooling, we mean that chip operating temperatures remain matched, i.e., substantially equal, during even extended operation at maximum rated power. Hopefully, chip temperatures remain substantially constant in temperature.

Matched cooling can be achieved by equal cooling of the device chips, or more precisely by equal cooling of the substrates on which they are disposed. It is conceivable that all that is needed is to cool the chips at a somewhat higher rate than the rate at which the chips generate heat. If so, each chip could be cooled at a somewhat different rate. However, the rate should be considerably greater than the rate at which heat is generated by the chip, effective to maintain the chip below a predetermined operating temperature. It would seem, however, that matched cooling would be preferred. It might be obtainable, for example, by symmetrically disposing the device chips on a substrate, and cooling the entire substrate uniformly, or at least in the substrate portion where the chips are disposed. Alternatively, one might choose to selectively, but uniformly, cool each substrate area where a chip is disposed.

A fourth aspect of electrical symmetry is used in this invention as well. The fourth aspect of electrical symmetry resides in providing a predetermined, usually matched, control signal to each of the paralleled semiconductor devices in the module. To achieve this goal in an insulated gate controlled semiconductor switching device, the gate control circuitry should provide an identical control voltage to each device. We recognize this is possible to do by design. However, for commercial manufacturing convenience, we prefer to include at least one trimmable resistance in the gate circuit. In our preferred embodiments, we like to include a separate trimmable resistance in the gate circuitry for each paralleled substrate subassembly in the module. Each trimmable gate resistance can be trimmed after the gate circuit is assembled. In such instance the gate circuit can be made with considerably greater performance tolerance, and at lesser cost. The trimmable gate resistance is trimmed to provide equal voltage and/or current to each paralleled semiconductor device in the module. Such balance, or matching, of gate control signal is still another factor needed to preserve electrical symmetry in device operation. One may even want to include such a trimmable resistance in a package or module containing a single device, to tailor the output of such a package or module to be like that of another package or module.

Figure 4:
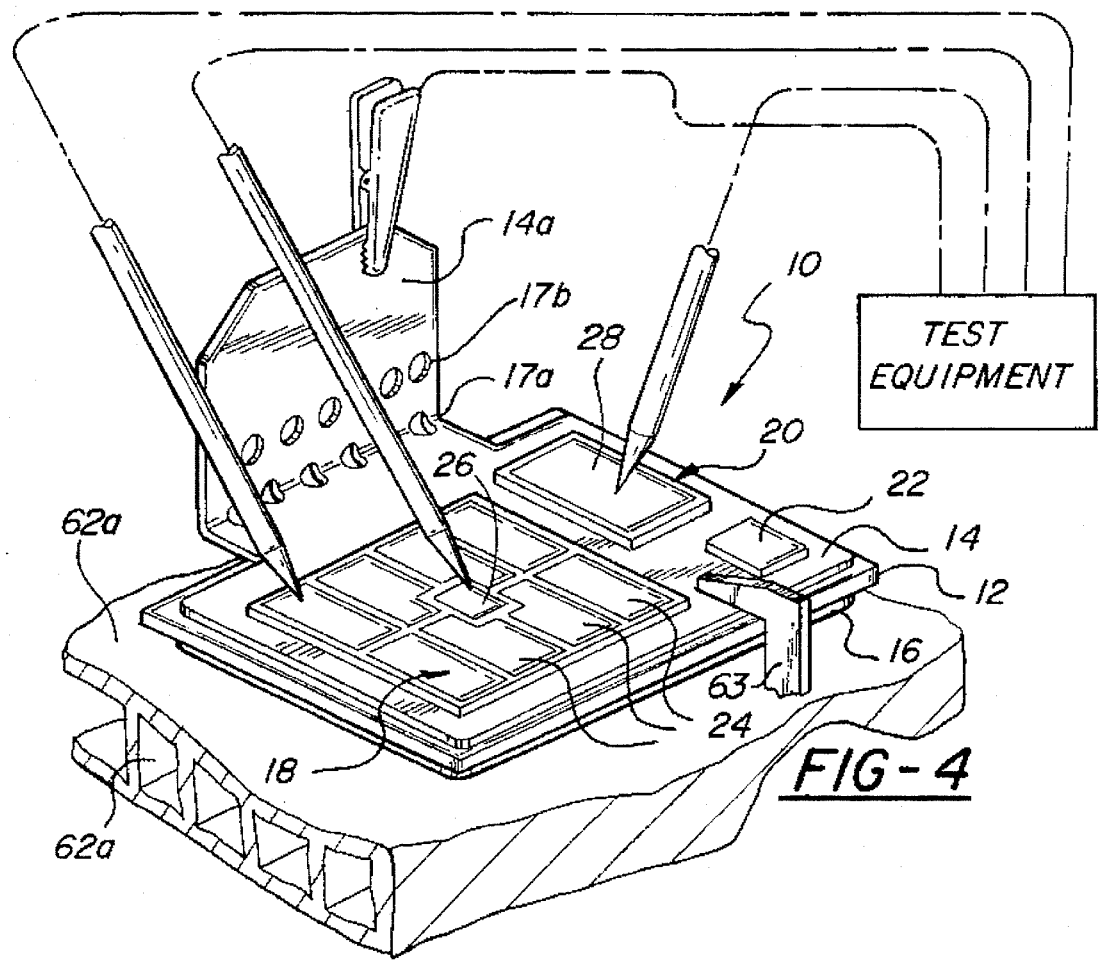
FIG. 4 shows a schematic view of a substrate subassembly being tested on a heat sink prior to incorporation into a module.

While not shown in FIG. 4, we prefer to dispose the trimmable resistance on our substrate subassembly, rather than on a circuit board (FIGS. 6–13) or on a module baseplate (FIGS. 13–20). Hence, more of the switching transistor's operating circuit is included when the substrate subassembly 10 is tested before mount on the module baseplate. This provides an even higher level of pre-testing accuracy, and substrate assembly matching.

The semiconductor switching devices contemplated for the high frequency substrate subassemblies and modules of this invention are preferably and most importantly insulated gate bipolar transistors (IGBTs). IGBTs are capable of significantly higher current densities and switching speeds than insulated gate field effect transistors (IGFETs), which are popularly also referred to as MOSFETs. IGBTs have been the devices of first choice for high power applications. However, they have previously not been used extensively, especially for large volume applications, because of difficulties in suitably packaging them.

One considerably difficult packaging problem for high frequency IGBT applications was high package inductance. This invention solves that problem, and others as well. For example, this invention makes it easier to use multiple IGBTs paralleled in a module as one switch. Hence, especially high current modules producing predetermined sine waves can be more readily commercially produced using this invention. A principle application of this invention is for switch modules to be used in an three phase inverter for an electric automobile AC motor.

On the other hand, MOSFET, or IGFET, modules can benefit from this invention too. Nonetheless, for simplicity, the following discussion will focus on IGBT modules, because they can benefit the most from this invention.

As to the modules contemplated in this invention, even a module containing only one semiconductor switching transistor chip can benefit from this invention. However, as indicated above, this invention is particularly beneficial for a module containing several switching transistor chips that are electrically in parallel. Such paralleled chips can form single or multiple switches.

A coaxial example of a single switch containing this invention is shown in FIGS. 6–13, which coaxial design is claimed in the previously mentioned U.S. Ser. No. 08/116,793. This invention is even more beneficial to multiple switch modules. A linear example of a high side/low side double switch is shown in connection with FIGS. 13–20, which linear design is claimed in the previously mentioned U.S. Pat. No. 5,444,295. A concentric version of a high side/low side double switch that will utilize this invention has been conceived, and is described and claimed in the previously mentioned U.S. patent application Ser. No. 08/278,199. It describes a complexly segmented triaxial concentric terminal that has coplanar terminal contact areas for all devices of both switches. It will make use of our unique pretestable five layer substrate subassembly 10'. However, each five layer substrate subassembly 10' will have its copper foil tabs bent slightly differently than shown in FIG. 21. Instead copper foil tabs 14a and 132a will be of the same length, and the upper bend will be at the same elevation above the surface of the upper copper foil layer, as is contemplated in the five layer substrate subassembly 10' examples shown in FIGS. 24 and 25. In such instance, the end of each tab, i.e., the top step of each tab, will be coplanar. Hence, they can be bonded to coplanar terminals in a single welding operation. The welding of the substrate subassembly terminal tabs to stepped or coplanar terminal members is described in the previously mentioned U.S. patent application Ser. No. 08/233,572.

In the above-mentioned triaxial coplanar module, the coplanar welded input and output tabs of our substrate subassemblies are respectively in low resistance electrical communication with input and output areas of a switching transistor chip mounted on the substrate subassembly. The individual substrate subassemblies are circumferentially arrayed around the triaxial terminal, analogous to the concentric, i.e., coaxial single switch embodiment shown in FIGS. 6–13 of the instant disclosure.

DETAILED DESCRIPTION

Reference is now specifically made to FIG. 1. FIG. 1 shows a substrate subassembly 10 that comprises a 21 millimeters by 14.5 millimeters beryllium oxide plate or wafer 12 of about 1 millimeter in thickness. Beryllium oxide is a particularly effective dielectric material for use in this application. It has a high thermal transfer coefficient but has a thermal expansion coefficient similar to that of silicon. Aluminum oxide and aluminum nitride also generally match silicon in thermal expansion characteristics. However, beryllium oxide has a thermal transfer coefficient considerably higher. In such instance, wafer 12 can be made correspondingly thicker, which, in turn, reduces parasitic capacitance between the upper surface and lower surfaces of wafer 12 which are metallized, as hereinafter described. We also hereinafter describe the metallized wafer as soldered to the surface of an electrically conductive bottom plate of a housing. Regardless of the size of the housing, or the number of switching transistors disposed in the housing, wafer 12 is only big enough to support one switching transistor and necessary associated circuitry, such as for thermal tracking or other symmetry purposes. This reduces the area of the metallized surfaces, and further reduces parasitic capacitance.

It should also be mentioned that the one millimeter wafer thickness mentioned in the preceding paragraph is a nominal thickness, and is a design compromise thickness. It is thicker than usually used, and is thick enough to reduce parasitic capacitance to an acceptable level in a module made as described herein for an alternating current (AC) automotive, i.e., electric vehicle, traction motor application. However, the wafer is not so thick as to unjustifiably raise wafer cost or reduce thermal transfer from the chip to an underlying heat sink or other cooling member. As mentioned, one millimeter is desirable for automotive traction AC motor applications, where one contemplates switching currents above about 135 amps per square centimeter of switching transistor chip active area at frequencies of about 30 kilohertz and at hundreds of volts. For less strenuous applications, a thinner wafer thickness may be acceptable. For more severe applications, a thicker wafer thickness may be desired.

Upper copper foil plate 14 and a lower copper foil plate 16 are disposed on opposite faces of wafer 12. Copper foil plates 14 and 16 are each about 20 millimeters by 13.5 millimeters and are about 0.25 millimeter thick. They are secured to the opposite major surfaces of beryllium oxide wafer 12 by any acceptable technique, as for example, direct copper bonding. Direct copper bonding is a known and accepted practice in which copper oxide is used to bond a copper sheet to a ceramic substrate. Upper copper plate 14 has an integral generally rectangular extension 14a that is about 14 millimeters wide and about 13.3 millimeters long. Accordingly it overhangs wafer 12 about 12.8 millimeters. The exposed portions of the copper foil on top of the wafer, i.e., excluding tab 14a, has a 6.35–10.2 micron silver coating thereon to enhance solderability.

Extension 14a has two lines 17a and 17b of 0.9 mm diameter holes on about 2.0 mm centers. Lines 17a and 17b substantially parallel the adjacent edge of the wafer 12. The center line of the row of 16a holes is spaced about 2.24 millimeter from the edge of the wafer. The centerlines of both rows of holes 16a and 16b are spaced about 2.36 millimeter apart. The row of holes 16a forms a first line 17a of stress relief in tab 14a. Line 17a is, thus, a first easy-bend or "stress riser" line in tab 14a. The row of holes 16b forms a second line 17b of stress relief in tab 14a. Line 17b is, thus, a second easy-bend or "stress riser" line in tab 14a. As can be seen in FIG. 1, tab 14a has two opposite right angle bends along bend lines 17a and 17b that form a step in tab 14a. This step facilitates connection of the substrate subassembly to the center terminal member, as well as providing thermal cycle stress relief between the substrate subassembly 10 and the center terminal assembly, as will be later apparent.

Figure 9:
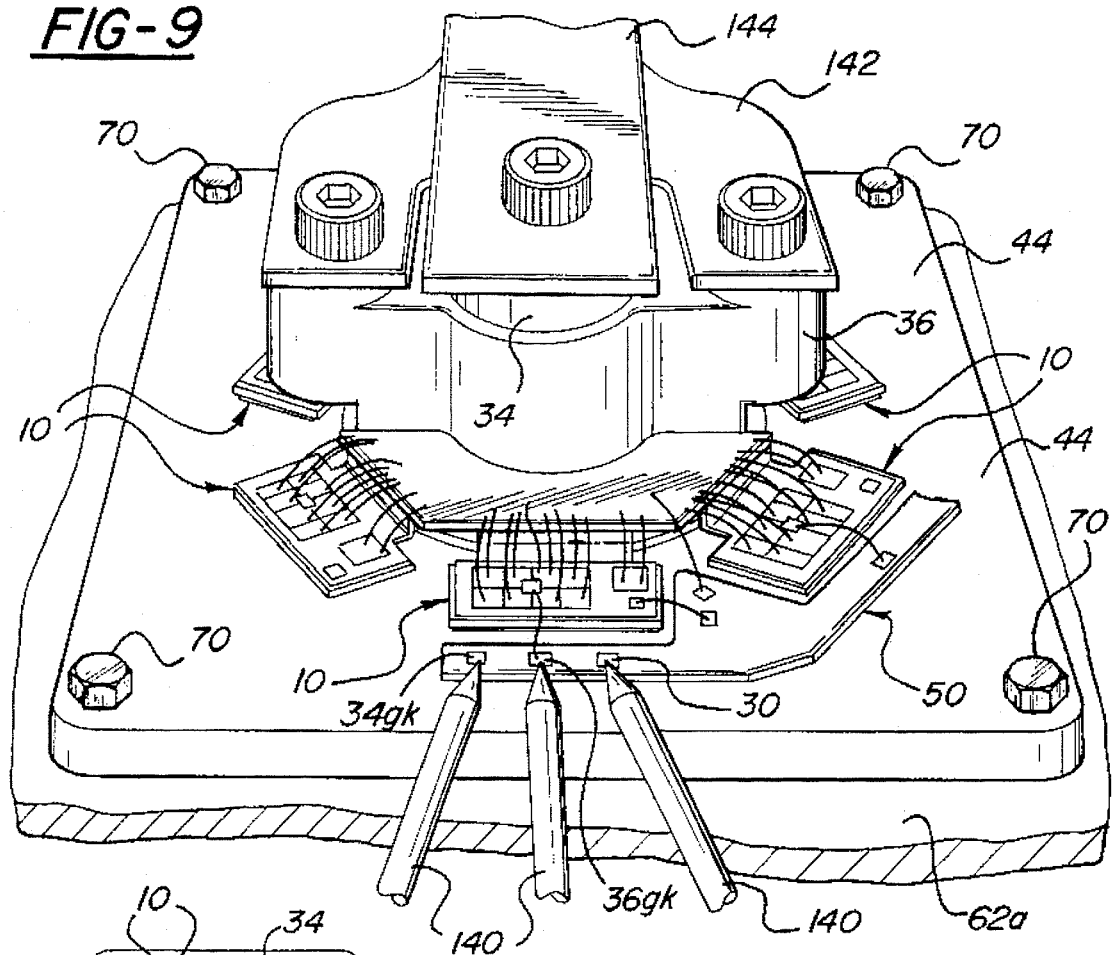
FIG. 9 shows a perspective view of a partially finished module being tested after matched substrate subassemblies are mounted but prior to final assembly of the module.

A silicon semiconductor switching transistor 18, such as an insulated gate bipolar transistor (IGBT) or an insulated gate field effect transistor (MOSFET), is disposed on the exposed major surface of upper copper plate 14. A soft, fast silicon semiconductor diode (SFD) 20 is also disposed on the exposed major surface of upper copper plate 14, next to switching transistor 18. Such a device is not considered to be an insulated gate device, or a high powered semiconductor switching transistor. A small plate 22 is also disposed on copper plate 14. Small plate 22 is present to facilitate bonding of an aluminum filamentary wire to copper plate 14. If the filamentary wire that is bonded is of aluminum, it is preferred that the small metal plate 22 have an aluminum outer surface. Small metal plate can be of an aluminum/copper laminate with the copper side soldered face down on the outer surface of copper plate 14. On the other hand, it is recognized that small metal plate 22 could be of any material that is metallurgically compatible with the filamentary connecting wire used. Analogously, the lower surface of small metal plate 22 can be of any material compatible with the process used to bond plate 22 to upper copper plate 14. The filamentary bonding wires are shown in FIGS. 8 and 9 of the drawing.

Figure 2:
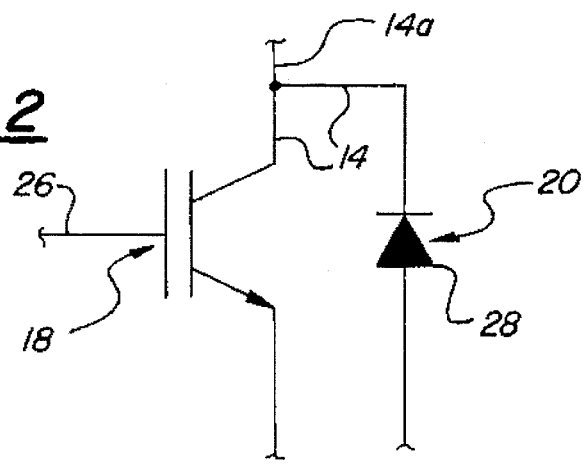
FIG. 2 shows an electrical schematic of the switching transistor substrate subassembly shown in FIG. 1.

FIG. 2 is an electrical schematic of the subassembly illustrated in FIG. 1. The diode chip 20 forms a blocking diode across the emitter collector terminals of the switching transistor. It is used to protect the switching transistor 18 by shunting current from temporarily reversed voltages that may occur in the system in which this switch is used. As can be seen from FIGS. 1 and 2, each switching transistor 18 is paired with a shunting diode. The transistor chip 18 and diode chip 20 are preferably made of substantially similar semiconductor material, and by substantially similar processes so that they can have substantially similar performance characteristics, including change in initial characteristics with change in temperature. Still further, each shunting diode 20 is disposed in close thermal proximity to its switching transistor 18 so that the pair would experience a similar temperature environment. This aids in providing more consistency in operation of the resulting switch.

Figure 3:
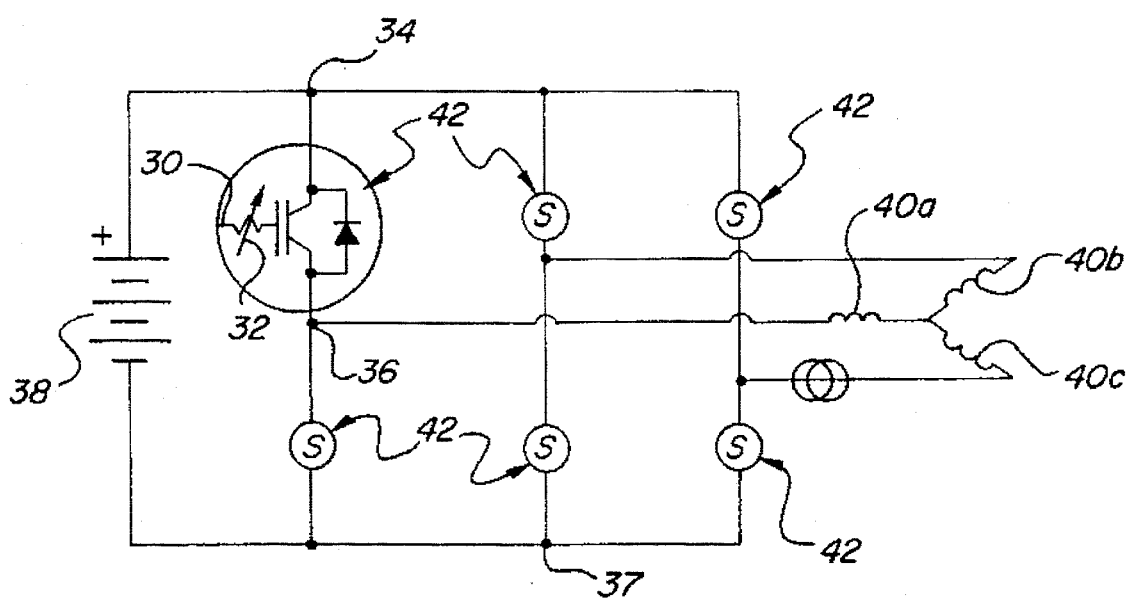
FIG. 3 shows an electrical schematic of a three phase DC to AC inverter which uses six switching transistors or six of the single switch modules shown in connection with FIGS. 6–13.

FIG. 3 shows an electrical schematic of a three-phase inverter circuit that converts direct current (DC) from a battery 38 to alternating current (AC) for use by a alternating current motor 40. As it can be seen, each of the three motor windings 40a, 40b and 40c is connected between a pair of switching transistors, or a pair of two groups of electrically paralleled switching transistors. Each transistor, or group of such transistors, forming a single switch is indicated by reference numeral 42. Each such switch 42 can thus be the module represented in FIGS. 6–13, or more importantly a module made in accordance with this invention. For clarity of illustration only one transistor/diode pair and its associated terminal resistance is shown in FIG. 3 in the enlarged area. As indicated above, when IGBTs are used for such switches, they cannot be satisfactorily used by just turning them on and off once for each cycle they are to cover. These devises turn "on" hard, which produces a square wave, not a sine wave. To get appropriately configured sine wave output, IGBTs are turned "on" and "off" very rapidly, many times during each sine wave cycle, using increasing and then decreasing gate voltage and pulse width modulation. Turn on/turn off frequencies of 20,000–30,000 Hz are not unusual for automotive traction motor applications. As previously indicated, the parasitic capacitance associated with such rapid switching is so significant that it has heretofore prevented high power IGBTs from being extensively used. This invention reduces such parasitic capacitance to a low level and reliability and performance to a high level. The improvement is so great that the inventions disclosed herein are incorporated in modules for an automotive electric vehicle AC traction motor application of a major manufacturer.

As indicated above, a plurality of pairs of such switching transistors 18 and shunting diodes 20 would normally be used in parallel for high power switches. Six such pairs are electrically paralleled to form a single switch module such as shown in FIGS. 6–13. Each gate lead for each switching transistor 18a–18f has a trimmable resistance 32a–32f in series with it. Its importance will hereinafter be explained. The six switching transistors, and their associated diodes, are electrically paralleled. As mentioned, in order to make such a paralleled circuit, only switching transistors having quite similar electrical performance characteristics should be used. In such instance, no one switching transistor will tend to "hog" current, and cause an avalanche failure of the transistor and then the module. Analogously, care must be taken that all the paralleled transistors are mounted the same, so that they are more likely to be at the same operating temperature and will perform the same after mounting.

Others might think that the foregoing indicates all the transistors in a multiple switching transistor module should be mounted on a common ceramic substrate. However, we have recognized that if all the transistors are mounted on a common substrate, the substrate becomes unduly large in area and complexity. Masking of the substrate for selective metallization may be required. The large area tends to increase parasitic capacitance between the top metallized surface of the ceramic substrate and a conductive backplate on which it will be disposed. The large area may also preclude use of beryllium oxide, even though its higher thermal transfer rating might allow a higher current rating and/or produce a lower parasitic capacitance in the resulting module. Increased complexity, that would be inherent to the large substrate, reduces yields of the large substrate, and thereby increases its cost.

One of the important inventions disclosed in this application is that each switching transistor is disposed on its own ceramic substrate. As indicated above, this is used to minimize individual and total size of the substrate. However, this provides still another benefit. If the substrates are relatively small, substantially the entire substrate surfaces can be metallized, without appreciably increasing parasitic capacitance. This eliminates masking for metallization. Elimination of masking, further reduces cost. Yields of transistor groups will increase, because imperfect one transistor/substrate combinations or subassemblies can be discarded before the groups are formed. In addition, the mounting of a smaller substrate onto the housing bottom plate is easier, and more readily fixable if the initial mount is not satisfactory. Accordingly, yields can increase still further. Increased yields, of course, mean lower cost products, and indirectly superior products.

A corollary to the foregoing is that such cost reductions tend to make use of beryllium oxide even more practical for larger volume use. Hence the attendant increase in module performance becomes more practical for commercial production applications, and improved products more available to the public.

Figure 5:
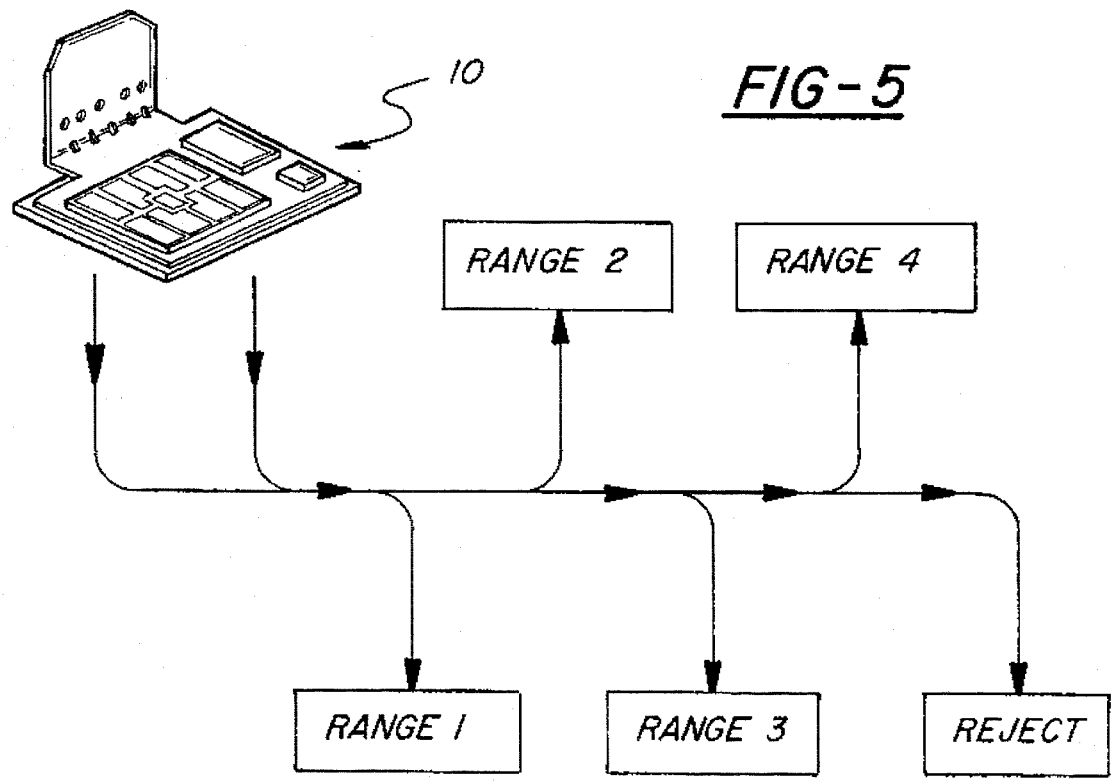
FIG. 5 shows a diagrammatic view of substrate subassemblies being sorted into performance categories based on the testing of FIG. 4.

Reference is now made to FIGS. 4 and 5. Each substrate subassembly 10 can be individually tested, graded, and sorted after being made. Unsatisfactory chip/substrate combinations, i.e., substrate subassemblies, can be discarded or repaired before any more value is added to them and while the repair might still be readily done. This affects cost. From a module performance standpoint, grading substrate subassemblies 10 before grouping is very important. The sorting of tested substrate subassemblies into performance groups is illustrated in FIG. 5.

Unmounted power switching transistor chips cannot be tested as thoroughly as the mounted chips. For test our substrate assemblies 10 are placed on a heat sink or liquid cooled member 62, and pressed firmly against it by any convenient means, such as by clamp 63. Now, more power can be applied to transistor 18, and the substrate subassemblies, can be graded and matched better. From a module performance standpoint, this is very important. We mentioned above that with better initial matching, the poorest performer in any group is still close to the best. Accordingly, even if the group must be operated at the power level of the poorest performer to prevent current "hogging", the group can now be operated closer to the power level of the best. It also follows that increased reliability of the module is obtained from pre-testing of the mounted chips at a significant power level. It follows then that increased performance groups can now be realized, and/or that the average power level utilization of all transistors used in groups can be increased.

Further, we recognize that there are differences in length, and an attendant variance in voltage drop, in the gate lead 30g to the respective switching transistors 18a–18f in a module. In this invention, even slight differences in a gate lead voltage drop can be avoided. We propose including a trimmable resistor 32a–32f in the gate lead between 30g and each of switching transistor 18a–18f, respectively. Each of the trimmable gate lead resistors allows the gate voltage supplied to each transistor to be the same. Thus, the "on" resistance characteristics of each switching transistor in the group comprising the resulting module is more likely to be similar. This helps make actual performance of the switching transistors match even more after mount. In FIGS. 6–13, the trimmable resistor is on a circuit board next to the substrate subassembly. In FIGS. 13–20 it is directly on the module baseplate. In our most preferred form, FIGS. 21–25, it is on the substrate subassembly itself, so that it can be included in the pre-testing (and sorting) of the substrate subassembly.

On the other hand, the trimmable resistor may even be used to adjust operating level of the mounted and assembled group to the level of lowest performance switching transistor substrate subassembly as mounted on the baseplate. If such mounting is not consistently done, substrate cooling may not be the same from one substrate subassembly to the next. The trimmable resistor could be used to match performance, and reduce any tendency for current "hogging" in the group. Such a resistance can even be used to match the switches paired in an inverter, especially if only one or two transistors are used for each switch and they are in the same housing. This is one of the reasons that resistance 32 is shown in the enlarged switch 42 in FIG. 3.

Referring back to FIG. 1, the surface of switching transistor 18 is divided into a multiplicity of aluminum electrode or contact areas, i.e., wire bond areas, to reduce emitter series resistance. In this example, there are eight such areas. They surround a smaller rectangular aluminum alloy gate electrode or contact area 26. In this example, chip 18 is an IGBT. The back side of the chip 18 forms a collector region for the switching transistor 18, which region is in low resistance electrical communication with copper plate 14, as by soldering or the like. The larger rectangular regions 24 on the upper surface of chip 18 form generally uniformly spaced emitter contacts on the IGBT surface. As indicated above, emitter contacts 24 surround the central gate electrode contact region 26. A single filamentary wire is adequate for gate lead contact because the gate lead does not carry much current.

The emitter region of the diode chip 20 is its entire upper surface, which is metallized to have an electrode thereon 28 of aluminum alloy suitable for "wire bonding". The lower surface of diode chip 20 is soldered to the upper surface of copper plate 14. Accordingly, the cathode of chip 20 and the collector of the switching transistor 18 are electrically paralleled, as shown in FIG. 2.

FIGS. 6–13 show IGBT switching transistors 18a–18f, which are respectively paired with soft fast shunting diodes (SFDs) 20a–20f. The switching transistors 18a–18f respectively have gate leads 30a–30f. Gate leads 30a–30f respectively have trimmable electrical resistances 32a–32f. As indicated above, the trimmable electrical resistances 32a–32f are included in each respective gate lead between gate conductor 30g and each of switching transistors 18a14 18f. For an IGBT power transistor having a die size of about 9.8 millimeters×9.8 millimeters, a trimmable resistor having a nominal printed resistance of about 4 ohms (trimmable to about 7.5 ohms) can be used. Gate leads 30a–30f, including their respective series resistors 32a–32f, are electrically connected in parallel to gate conductor or lead 32g. Gate conductor 32g leads to a gate terminal, indicated by G and reference numeral 30.

Transistors 18a–18f respectively have collector leads 34a–34f. Transistors 18a–18f respectively have emitter leads 36a–36f. Collector leads 34a–34f are each connected to a common lead 34g, which electrically parallels all of the collector leads 34a–34f. Analogously, emitter leads 36a–36f are each connected to a common lead 36g, which electrically parallels all of emitter leads 36a–36f. Collector lead 34g is a low resistance communication with center terminal 34. Emitter lead 36g is in the low resistance electrical communication with the coaxial emitter terminal 36.

Two additional leads are shown to each of the transistors 18a–18f. These are leads used to determine potential of the collector and emitter leads, to continuously monitor their operating characteristics during operation of the module. We prefer to chiefly monitor deviations from predetermined values. We refer to these connections as "kelvin" connections. Collector kelvin leads 34ak–34fk are respectively connected to the collectors of transistors 18a–18f. Analogously, emitter kelvin leads 36ak–36fk are connected to the emitter leads of transistors 18a–18f. Lead 34gk ties collector kelvin leads 34ak–34fk together, in an electrically parallel arrangement, and places each of them in low resistance contact with the collector kelvin terminal 36k. Analogously emitter kelvin lead 36gk electrically parallels all emitter kelvin leads 36ak–36fk and places them in low resistance electrical communication with emitter kelvin terminal 34k.

The concentric terminals 34 and 36 respectively comprise output and input terminal posts for the module. The six transistor/diode pairs are shown circumferentially symmetrically arrayed around the center terminals. The array is as uniform as the structure appears to permit. It results in collector leads 34a–34f being of substantially the same length. Corresponding portions of emitter leads 36a–36f are also of substantially the same length. Gate leads 30a–30f, including their trimmable resistors 32a–32f, are all of about of the same length. One can consider that transistors 18a–18f, collector leads 34a–34f and emitter leads 36a–36f are radially arrayed about the coaxial center terminals. Gate leads 30a–30f can be considered as radially arrayed too.

Concentric gate lead 30g, concentric emitter kelvin lead 36gk and concentric collector kelvin lead 34gk surround the circle of transistor/diode pairs. These leads respectively are connected to module gate terminal 30, collector kelvin terminal 34k and module emitter kelvin terminal 36k. Gate leads 30a–30f are symmetrical and are each connected to concentric gate lead 30g. Collector kelvin leads 34ak–34fk are each connected to concentric collector kelvin lead 34gk. The emitter leads only have two kelvin leads, 36ck and 36dk. They are connected to concentric emitter kelvin lead 36gk.

The module of FIGS. 6–13 also comprises a baseplate 44 on which is disposed a ring-like housing member 46 and a cover member 71. These three elements form a substantially closed chamber around the electrical components.

Baseplate 44 is a rectangular plate about 2–4 millimeters thick, 108 millimeters wide and 124 millimeters long. It is preferably of a highly thermally conductive material that has a thermal expansion coefficient approaching that of silicon. One might think that metal would be preferred as a baseplate 44, because of its high thermal conductivity. However, most high thermal conductivity metals also have a relatively high coefficient of expansion. Silicon has a relatively low coefficient of expansion. Large differences in the coefficient of expansion are objectionable.

The known metals having a thermal expansion coefficient close to silicon, such as FERNICO, KOVAR, INVAR and the like, also have relatively low thermal conductivity. Accordingly, we prefer to use laminated, or other types, of composite materials for baseplate 44. They are more desirable for this application because they are designed to have good thermal expansion matching to silicon, and relatively high thermal transfer properties. The most attractive of such composites for our application are metal/ceramic composites. Since they include metal, they are generally electrically conductive, which we believe is a strong asset in our subject application. Such a composite baseplate offers significant benefits to the subject invention, even though the silicon chips are disposed on discrete ceramic substrates, as hereinafter described. Hence, metal is not recommended for baseplate 44 even though effective cooling is important, as hereinbefore mentioned. On the other, hand we have found that a metal/ceramic composite can be quite effectively used in our application. It not only can be made to have high thermal conductivity but also relatively low in its rate of expansion. We prefer to use a composite material that has a coefficient of expansion somewhat close to that of silicon. More precisely, however, we want the composite baseplate 44 to closely match the coefficient of expansion of the composite ceramic substrate subassembly on which the silicon chip is directly supported. We want the substrate subassembly to be quite similar to silicon but recognize the it may not be an exact, precise match. If the substrate subassembly coefficient of expansion does not exactly match that of silicon, that we prefer that the thermal expansion coefficient of the baseplate 44 match that of the substrate subassembly, not the silicon. The substrate subassembly will hereinafter be more fully described. As indicated, we prefer that the substrate be electrically conductive and solderable. Many metal/composites are commercially and experimentally available. If not inherently solderable, they should be treated to make them solderable, at least in the areas where the substrate subassemblies are to be mounted.

When a substrate subassembly such as substrate subassembly 10 is soldered to a larger conductive support, the effective area of the substrate's lower copper plate 16 is increased. This enlarges parasitic capacitance. In turn, if the larger conductive support is supported directly on a still larger area aluminum heat sink member, parasitic capacitance increases even more. Using dielectric materials to space these items apart, is usually not desirable because it usually reduces thermal transfer. Hence, increased dielectric thickness is usually not considered desirable.

We have found one metal/ceramic composite that is particularly effective when used as baseplate 44 in this invention. It is sold under the designation MCX-693 by the Lanxide Corporation of Newark, Del. It has a coefficient of expansion of about 5–12 ppm per degree centigrade. We prefer 6 ppm per degree centigrade, which almost exactly the same as that of the Cu/BeO/Cu sandwich we use in substrate subassembly 10. This is close to that of silicon, which is about 3.2 ppm per degree centigrade. The MCX-693 material is essentially a combination of metal and ceramic in which the metal retains its identity sufficiently to provide high thermal conductivity. The ceramic retains its identity sufficiently to lower expansion coefficient but not thermal conductivity. We have found that the MCX-693 composite material additionally has fairly good mechanical strength. Thus it can serve as the baseplate itself, not as a support for it, which eliminates an additional thermal transfer interfaces. It forms a rugged module assembly. Further, it can be coated or plated to make its surface solderable.

Still further, the MCX-693 material has sufficient strength to allow it to be made as a hollow body. This allows the baseplate 44, itself, to also function as a cooling member. In such instance, baseplate 44 need not be mounted on a heatsink, such as heatsink 62, for cooling. It need only be mounted on a mechanical support analogous to what might be used for supporting the heatsink. This not only eliminates costs due to an additional member in the resulting system but eliminates a heat transfer interface. Eliminating a heat transfer interface, and its inherent losses, improves cooling. Improved cooling, in turn, allows the switching transistors to be operated at higher power levels.

Figure 11:
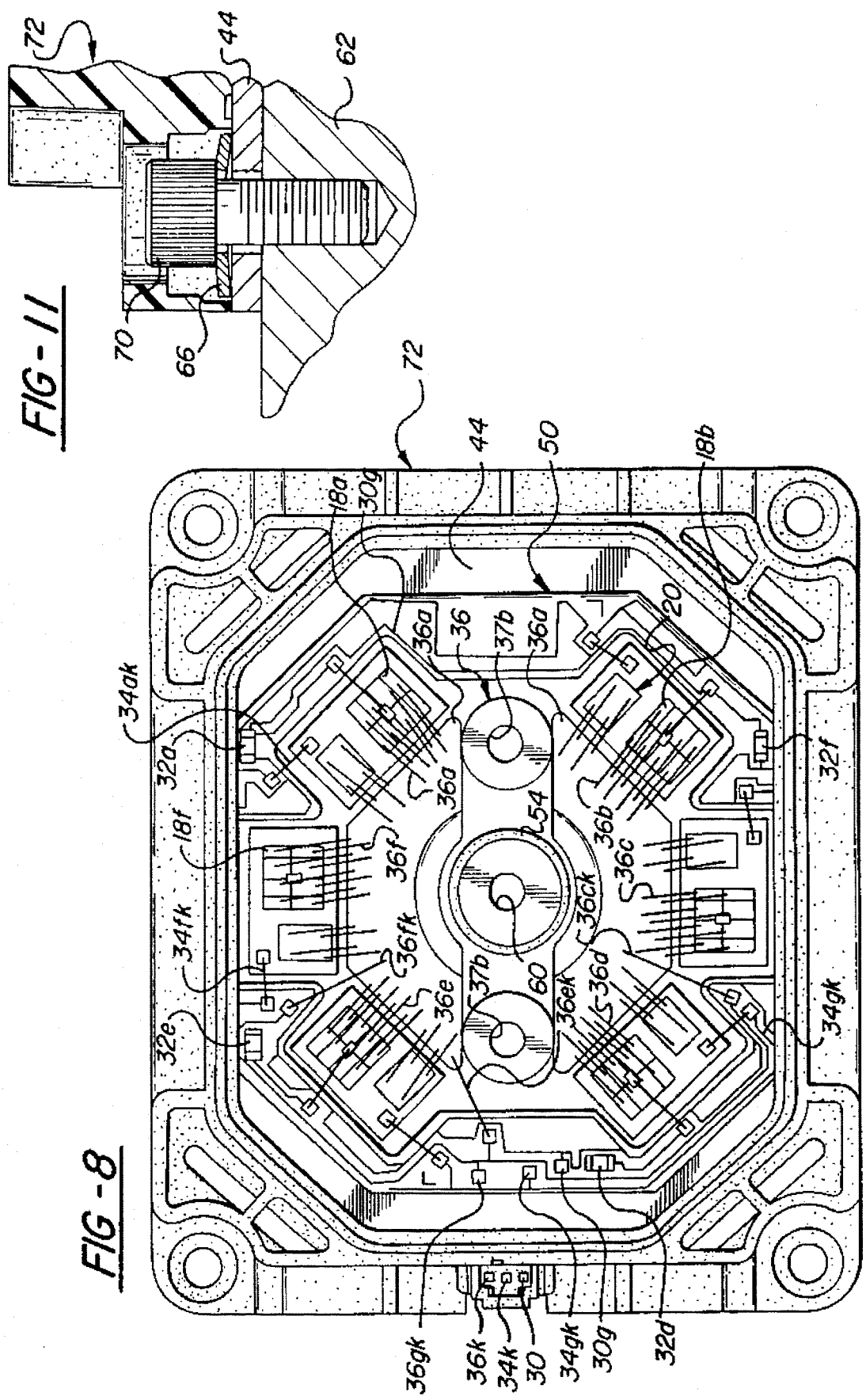
FIG. 11 shows a cross-sectional view along the line 11—11 of FIG. 6.

Disposed on baseplate or backplate 44 is a plurality of the substrate subassemblies 10. They are symmetrically arranged around center coaxial collector terminal 34 and emitter terminal 36 and soldered to baseplate 44. Also disposed on baseplate 44, surrounding substrate subassemblies 10, is a ring-like printed circuit board member 50. Ring-like circuit board element 50 is adhesively bonded to backplate 44 and supports gate conductor 30*g*, collector kelvin conductor 34*gk*, emitter kelvin conductor 36*gk*, and trimmable cermet resistor chips 32*a*–32*f*. Ultrasonically bonded filamentary wires form the electrical connections between the foregoing conductors and terminals, and the transistors and diodes on the substrate assemblies 10. They are shown in FIGS. 8 and 11.

It should be noted that the ring-like circuit board element 50 can be of the typical FR-1 epoxy/glass circuit board material that supports a copper layer which is defined into a conductor pattern. However, it can also be a porcelainized steel substrate on which a thick film cermet conductor pattern is printed. Disposed on, and adhesively bonded or soldered to, the ring-like circuit board 50 are the six alumina chip resistors 32*a*–32*f* hereinbefore referred to. Each trimmable resistor chip is disposed a given predetermined distance away from the transistor gate electrode to which it is to be connected. Thus, every gate lead between every transistor and its associated chip resistor is the same length. Each alumina chip has a cermet thick film resistor block printed on its upper face and a thick film cermet conductor coating enveloping each end, and overlapping onto the printed resistor block. If the enveloping end coating is solderable, it can be soldered directly to conductor 30*g* on circuit board 50. If not solderable, then the connection to 30*g* can be made by "wire bonding" after adhesively bonding the trimmable resistor chip to the circuit board 50. In any event, the trimmable resistor chip is affixed to circuit board 50 with its backside down, leaving the resistor-coated topside surface available for laser trimming. On the other hand, if circuit board 50 is of porcelainized steel, resistor chips would not necessarily be used. Instead the trimmable resistors 32*a*–32*f* would be integrally included in circuit board 50 and integrally interconnected with gate conductor 30*g*. Hence, a soldered or filamentary wire connection with 30*g* is also eliminated, along with discrete resistor chips. Nonetheless, the remaining discussion will describe the module as having discrete trimmable resistor chips.

One end of each of the trimmable resistors 32*a*–32*f* is connected to the gate electrode 26 of its respective associated switching transistor. This is done by means of a filamentary wire (shown in FIGS. 8 and 11) between the gate electrode 26 and wire bond contact pad or electrode on the trimmable resistor chip. Trimmable resistors 32*a*–32*f* are also disposed so that they are accessible for trimming or re-trimming at the end of assembly but before the housing cover 71 is put on.

It can be seen that each tab 14*a* of the respective substrate subassemblies 10 is welded to a circumferential flange on the inner coaxial terminal 34. Accordingly, inner coaxial terminal 34 forms the collector, or output terminal of the module. Tab 14*a* can be soldered or otherwise bonded in a low electrical resistance connection to the circumferential flange 34*a* on terminal 34. We prefer to make terminal 34*a* of copper and tab 14*a* of copper. Rather than soldering them together, we prefer to weld them together by electron or laser beam welding. A fixture and process for welding the tabs 14 to terminal flange 34*a* is described and claimed in U.S. patent application Ser. No. 08/233,572, to be filed soon in the names of C. T. Eytcheson, P. E. Tonies and D. E. Lake, assigned to the Substrate subassemblies 10 are attached to base plate 44 early in the assembly process because they are soldered. After they are tested, the lowermost central parts of the coaxial terminal assembly are affixed to the baseplate by adhesives. Tab 14 is bent up at bend line 17*a* in order to accommodate collector flange 34*a*. Because of bend line 17*a*, tab 14 can readily and safely be bent up before substrate subassembly 10 is soldered to baseplate 44. After terminal 34 is bonded to the board, the free end of tab 14 is bent down over terminal flange 34*a*, at bend line 17*b*. Tab 14 bends readily and safely at bend line 17*b*, and ends up somewhat parallel to the upper surface of flange 34*a* to which it is bonded. The welding method and apparatus of the above-mentioned U.S. patent application Ser. No. 08/233,572 take advantage of this pre-orientation of tab 14 on flange 34*a*, to clamp the two together, mask tab edges, and electron or laser beam weld tab interior portions 52 to flange 34*a*. If electron or laser beam welding could not be done, hand soldering of tab 14 to flange 34*a* might have been required, which would have significantly increased cost.

Figure 10:
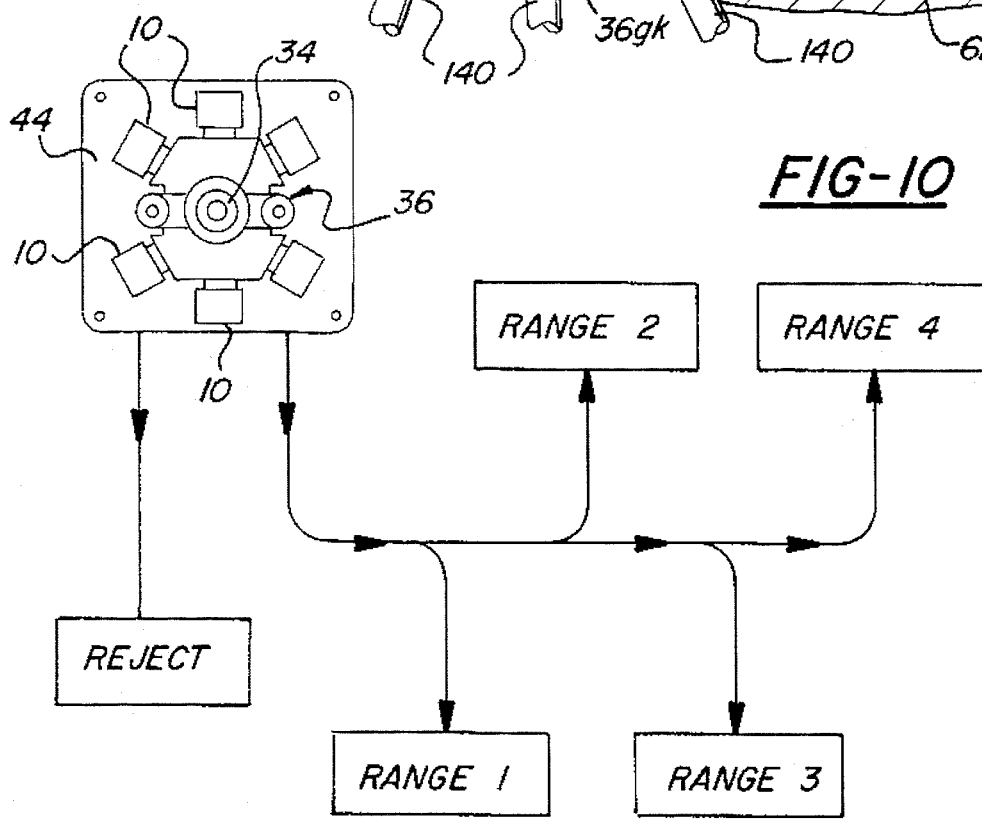
FIG. 10 shows a diagrammatic view of modules being sorted into performance categories based on the testing of FIG. 9.

FIGS. 9 and 10 show the module in the next stage of manufacture, after "wire bonds" have been made but before housing 72 is adhesively bonded to baseplate 44. By "wire bond" we mean the thermocompression or ultrasonic bonding of one end of a filamentary wire to an area on a semiconductor chip and the other end to a selected terminal element. FIG. 8 shows the FIGS. 9 and 10 structure after the housing member 72 has been bonded to baseplate 44. A generally cylindrical dielectric sleeve 54 surrounds terminal 34. Sleeve 54 has a circumferential outward flange 54*a* that overlies the outward circumferential flange 34*a* of terminal 34. Dielectric spacer 54 can be of any suitable electrically nonconductive material, such as plastic. Disposed on dielectric spacer 54 is the outer coaxial terminal 36, which also has an outward circumferential flange 36*a* disposed above the other circumferential flanges 34*a* and 54*a*.

Figure 6:
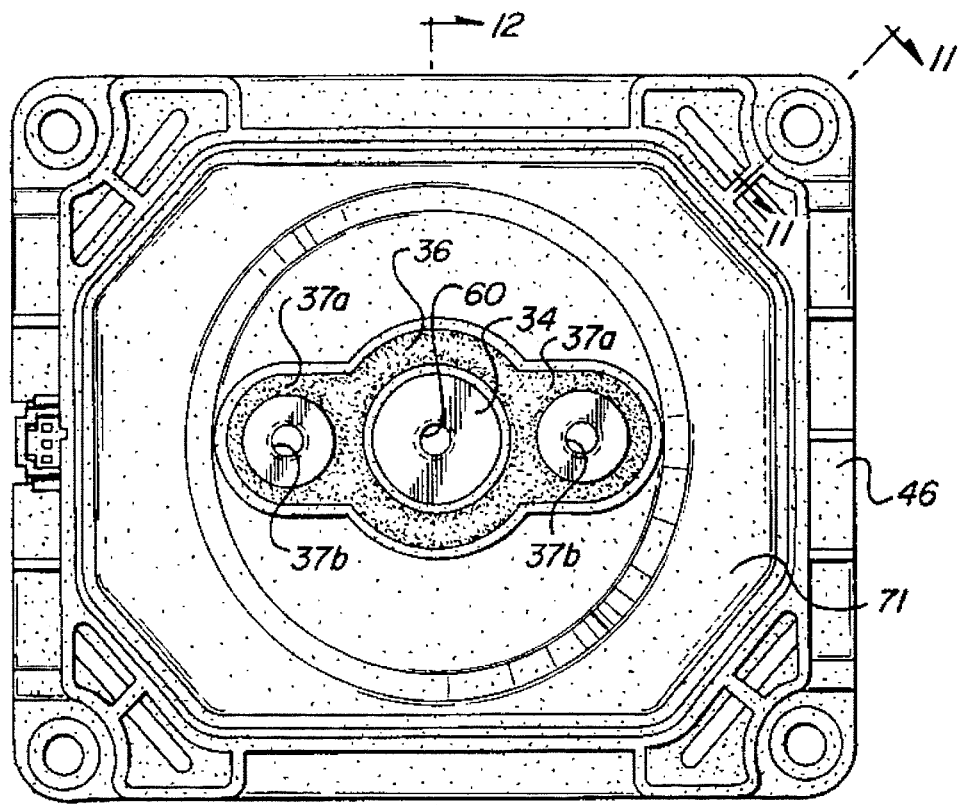
FIG. 6 shows a plan view of a single switch module having coaxial input/output terminals and cover in place.
Figure 7:
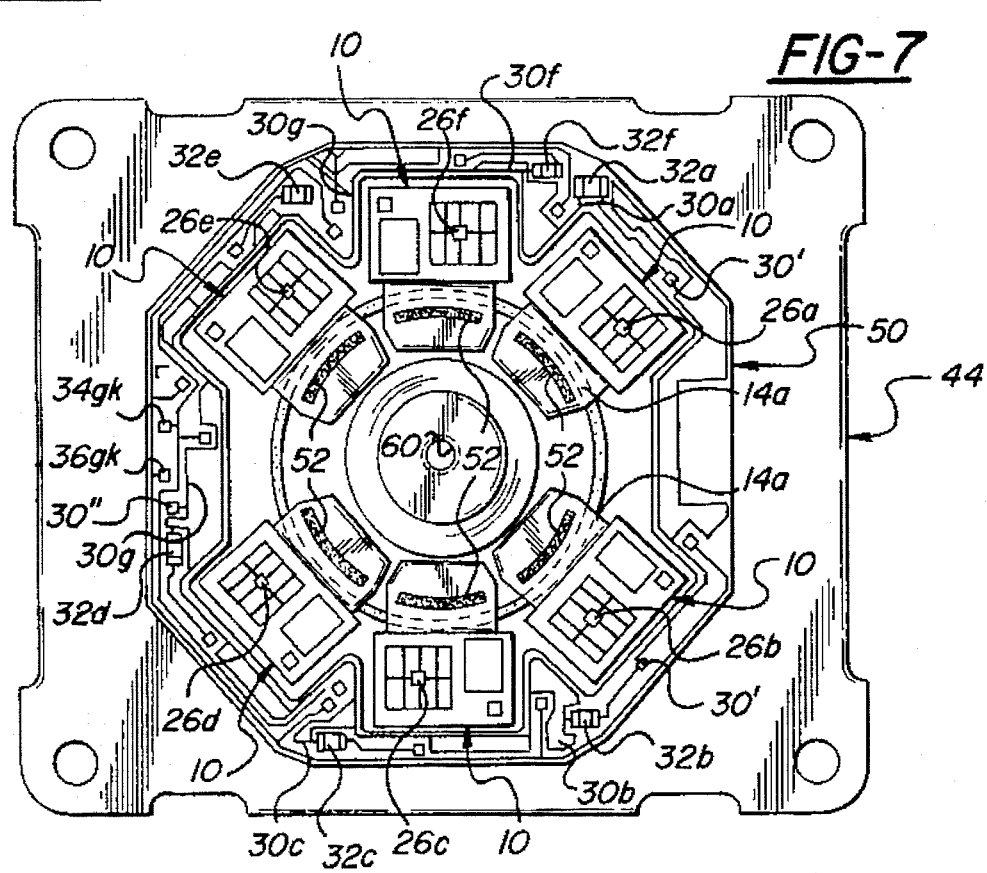
FIG. 7 shows a plan interior view of the module shown in FIG. 6 in an early stage of assembly before the outer coaxial terminal and housing side walls and top are included, showing a circular array of switching transistors and gate circuiting.

While terminal 36 is essentially cylindrical, it can be seen in FIGS. 6 and 8 that the central part of terminal 36 has two diametrically opposite enlargements 37. These enlargements are respectively bored and threaded at 37*a* to facilitate connection of a bus bar to terminal 36. The upper end of terminal 34 is axially bored and threaded, for connection to a collector bus. Having opposed bus connection points 37*a* on terminal 36 provides increased uniformity in electrical resistance between the emitter bus and the substrate subassemblies 10. It should be noted that a compromise has been made regarding opposed enlargements 37*a*. They are present to increase current uniformity but their presence interferes with the "wire bonding" head for the filamentary connector wires. It is intended in this invention that all filamentary wires of corresponding elements, for example 36*a*–36*f*, be of the same length.

As can be seen in FIGS. 8 and 9, the filamentary wires closest to the terminal enlargements 37, i.e., wires 36*a* and 36*d*, have to be angled slightly differently from the rest. This would make them slightly longer than the rest. However, this can be accommodated by matching their length in the other wires. It should also be noted that the hexagonal periphery of flange 36*a* provides a straight line edge on flange 36*a* opposite each substrate subassembly 10. This allows the multiple wires in each group of IGBT emitter wires 36*a*–36*f* to be closer to the same length. In addition, it should be recognized that each group of filamentary connecting wires 36*a*–36*f* is generally parallel to tab 14*a*. However, they are parallel in only in one plane, they are somewhat spaced apart, and are of a different configuration from tab 14*a*. Inductance cancellation between them, is therefore not optimum. The straight edges on terminal flange 36*a* allows the average length of the connecting wires 36*a*–36*f* to be shorter.

Hence the length of uncancelled inductance is shorter, reducing module losses and increasing performance.

It should be recognized that the filamentary wires 28a connect the emitter side of SFD chip 20 to flange 36a of input terminal 36. Filamentary wires 36a–36f respectively connect emitter areas 24 of transistors 18a–18f to flange 36a of input terminal 36. The filamentary wires and chip metallizations are preferably relatively thick aluminum alloy, effective to reduce series resistance.

Electrode 26 on chips 18a–18f are respectively in low resistance electric communication with laser trimmable chip resistors 32a–32f by means of filamentary wires 26a–26f. One end of each filamentary wire 26a–26f is bonded to the electrode 26. The other end is to the electrode on one end of the laser trimmable chip resistor. The electrode on the other end of each chip resistor is connected by a filamentary wire to a bond tab that is part of gate conductor pattern 30g on the patterned circuit board 50.

An emitter kelvin connection is made to flange 36a by a filamentary wire 36ak extending from flange 36 to a bond pad on circuit board 50, which bond pad is part of a collector kelvin conductor 36gk on circuit board 50.

Terminal 36 and in particular the upper surface of flange 36a is nickel-plated, to enhance bonding of aluminum filamentary wires thereto.

Trimmable chip resistors 32a–32f can be soldered directly to gate conductor 30g on board 50, as previously mentioned. If they are not, one end of a filamentary wire will have to be bonded to one end of the chip resistor and to the other to gate conductor 30g. In such instance, a wire bond pad is first soldered to the circuit board. The wire bond pads on board 50 and chips 32a–32f are of a material, or at least have a surface coated with a material, that is metallurgically compatible with the wire bonded thereto. An aluminum surface may be preferred if the filamentary wire is aluminum.

The collector kelvin connection is made by bonding filamentary wires 34ak–34fk respectively between the metal chip 22 on each substrate subassembly 10 and an adjacent bond pad that is part of kelvin collector conductor 34gk on circuit board 50. Filamentary wires 34ak–34fk can be of aluminum and ultrasonically bonded. Also as hereinbefore indicated, the bond pad surface on chip 22 should be aluminum, or of some other metal generally compatible with the bonding wire.

Flange 34a on terminal 34 is electrically isolated from backplate 44 by a circular flanged element 56 having a circumferential flange 56a, and a central tubular portion 56b. Flange 56 has boss 56c on its lower surface that cooperates with a corresponding recess in the upper surface of baseplate 44. This locates element 56 on baseplate 44. It also gives an added mechanical lock between them, to prevent twisting of the coaxial terminal assembly when the bus bars are attached to it and bolted in place.

Element 56 is adhesively bonded to the upper surface of backplate 44 and to the lower surface of flange 34a of terminal 34. Flange 56a has recesses 56b in its upper and lower surfaces. The recesses 56b induce a more uniform thickness of adhesive between element 56 and underlying baseplate 44 and overlying flange 34a. Element 56 can be of any suitable dielectric material as for example, a nonconductive plastic. It can be of the same material as the dielectric spacer 54. It should also be mentioned that spacer 54 is adhesively bonded to the upper surface of terminal 34 and its flange 34a and to the lower surface of outer terminal 36 and its flange 36a. A circumferential adhesive recess 54b is provided in the upper surface of flange 54a analogous to the circumferential recesses 56b provided in the upper and lower surfaces of flange portion 56a of lower spacer 56.

The input and output terminals 34 and 36 and their associated spacers 54 and 56 have been described and shown as separate elements. They do not all have to be separate. It is conceivable that terminal elements 34 and 36 could be insert molded into a metal/plastic terminal subassembly. In such a subassembly, plastic is molded around terminals 34 and 36 but leaving their critical contact surfaces exposed. Thus, only electrical contact parts of them are exposed. Their other parts are embedded in a matrix of electrically nonconductive plastic, that serves the function of spacers 54 and 56. In such instance reliability and cost should be increased because the resultant subassembly only has one surface to be adhesively bonded. That one surface is the bottom of the terminal subassembly, which would be adhesively bonded to baseplate 44.

As seen in FIG. 8, after the entire subassembly thus far described is formed, it is surrounded by an electrically nonconductive plastic housing member 72, which includes embedded gate terminal 30, embedded kelvin collector terminal 34k and embedded emitter kelvin terminal 36k. These terminals are embedded because it is preferred to mold them into the housing member 72. In such instance, each of terminals 30, 34k, and 36k are initially part of a single lead frame during molding. The lead frame has web portions (not shown) that hold the terminals together for molding. The lead frame web portions are not covered by the molding compound and are removed after molding, as is usual. Accordingly, the web portions are not shown in the drawing. After the housing 72 is bonded to the baseplate 44, "wire bonds" are made between the circuit board contacts and exposed inner ends of the housing lead frame. More specifically, one end of a filamentary wire is bonded to circuit board contact 36gk, and the other end bonded to an exposed inner end of the housing lead frame element extending from terminal pin 36k. One end of a filamentary wire is bonded to circuit board contact 34gk, and the other end bonded to an exposed inner end of the housing lead frame element extending from terminal pin 34k. One end of a filamentary wire is bonded to circuit board contact 30g, and the other end bonded to an exposed inner end of the housing lead frame element extending from terminal pin 30.

After the "wire bonds" are made between the substrates and the input terminal, output terminal and the circuit board, but before the housing 72 is added to the assembly, the substrate subassemblies 10 can be tested as a group. Such testing is illustrated in FIG. 9. If rejects occur, they can be repaired or rejected before more value is added and repair is easier.

If rejects at this point are not a problem, it may be preferred to test the module in the form illustrated in FIG. 8. In such instance, the test probes 140 shown in FIG. 9 would not be necessary. To test the module after housing 72 is installed, circuit board contacts 30g, 34gk and 36gk need not be probed for electrical connection. All one needs to do is make a terminal plug type of connection to housing terminal pins 30, 34k and 36k, in addition to attaching input and output busses 142 and 144. In any event, for most representative testing, one would want to cool the baseplate 44 of the module during testing. Accordingly, baseplate 44 is shown bolted to a heatsink or other such cooling member 62a in FIG. 9. It is to be understood that the internally cooled baseplate of FIGS. 14–20 could be substituted for the baseplate 44 illustrated in FIGS. 6–13. In such instance, baseplate 44 would only need to be connected to a source of coolant. It would not have to be mounted on a cooling support. In either case, with proper cooling provided, the module can be tested in this form at substantially full power. To do so, input and output bus members 142 and 144 can be respectively bolted to the terminal members 34 and 36.

FIG. 10 illustrates that the rejects can be discarded or repaired at this point. Also, since the modules can be tested at substantial or actually full power, their performance can be accurately measured. Thus, the modules themselves can precisely sorted into performance groups at this point, which is also illustrated in FIG. 10. Such testing and sorting might also, or alternatively, be done after final assembly of the module. In such instance, the performance characterization permits one to select only precisely similarly performing modules for a given inverter application. On the other hand, if prior testing and grading, and/or repair, has been successful, the modules will not have a wide range of performance at final assembly. In fact, this is one of the objects of this invention. If so, sorting into more than one performance group after final assembly testing may not even be necessary. However, if the assembly process does not have high yields of the preferred product, one has the option of testing both at the FIG. 10 and final assembly points. Hopefully, substantially all rejects will have been identified at the FIG. 8 or FIG. 10 point of assembly, and rejects discarded or repaired.

It should also be recognized that this invention provides a manufacturing advantage. Most, if not all, of the assembly steps likely to cause variation in the resultant module, including its rejection, are performed on the substrate subassemblies. Accordingly, yields in assembling the substrate subassemblies into a module can be quite high. They might even be high enough to omit the testing illustrated in FIGS. 9 and 10. Instead, as indicated above, one may choose to defer such full current testing, and sorting (if appropriate), until after final assembly of the module is completed.

Reference is now made once again to FIG. 8, to finish description of the module and its method of assembly. Housing member 72 and baseplate 44 are rectangular in their external configuration even though they house concentric terminals and a circular arrangement of components. This provides the largest area of contact between baseplate 44 and the surface of its supporting member, as for example heat sink 62, when many such housing assemblies are disposed on heat sink 62. Housing member 72 is adhesively bonded to the upper surface of baseplate 44. The adhesive is not shown. Recesses 72b, and surrounding land areas, are provided in the lower surface of housing member 72, for adhesive thickness uniformity.

As seen, housing member 72 is essentially a rectangular ring. Its bottom is closed by the baseplate 44. Its top is closed by a cover 71 having a rectangular periphery that nests in a groove on the top edge of the housing member 72. The groove is filled with a silicone adhesive of the type previously described. One such adhesive is available from Dow Chemical Company of Midland, Mich., and is typical of silicone adhesives used for semiconductor devices and hybrid circuit devices. The adhesive is not shown, to better focus on the important new features of this invention. For the same reason, a filling of silicone oil, grease, or resin is not shown in the drawing. The use of a silicone filling is not new. It is commonly used as a filler, and at least as a coating, in semiconductor device packages. It not only passivates the chips but the resin helps mechanically. Terminals 34 and 36 project up out of the module through a conforming recess in the cover 71, as shown. The silicone filling can be substantially completed before cover 71 is seated in the groove on the top of the housing 72, and then finished after the cover is seated. This may include a bead of resin filling the space between the terminal 36 and the center aperture of the cover 71.

As indicated above, the completed switch assembly, i.e., module, is mounted on the upper surface of heatsink 62, probably with other such modules (not shown). It will likely share the heatsink with other modules, if it is part of the three-phase inverter circuit illustrated in FIG. 3. Baseplate 44 of the module is affixed to the heatsink 62 by means of center bolt 58 and corner bolts 70. As is typical of such installations, a layer of silicone grease is preferably disposed between the baseplate 44 and the heat sink 62, to insure good thermal transfer between the facing surfaces even if they are not perfectly flat.

Figure 12:
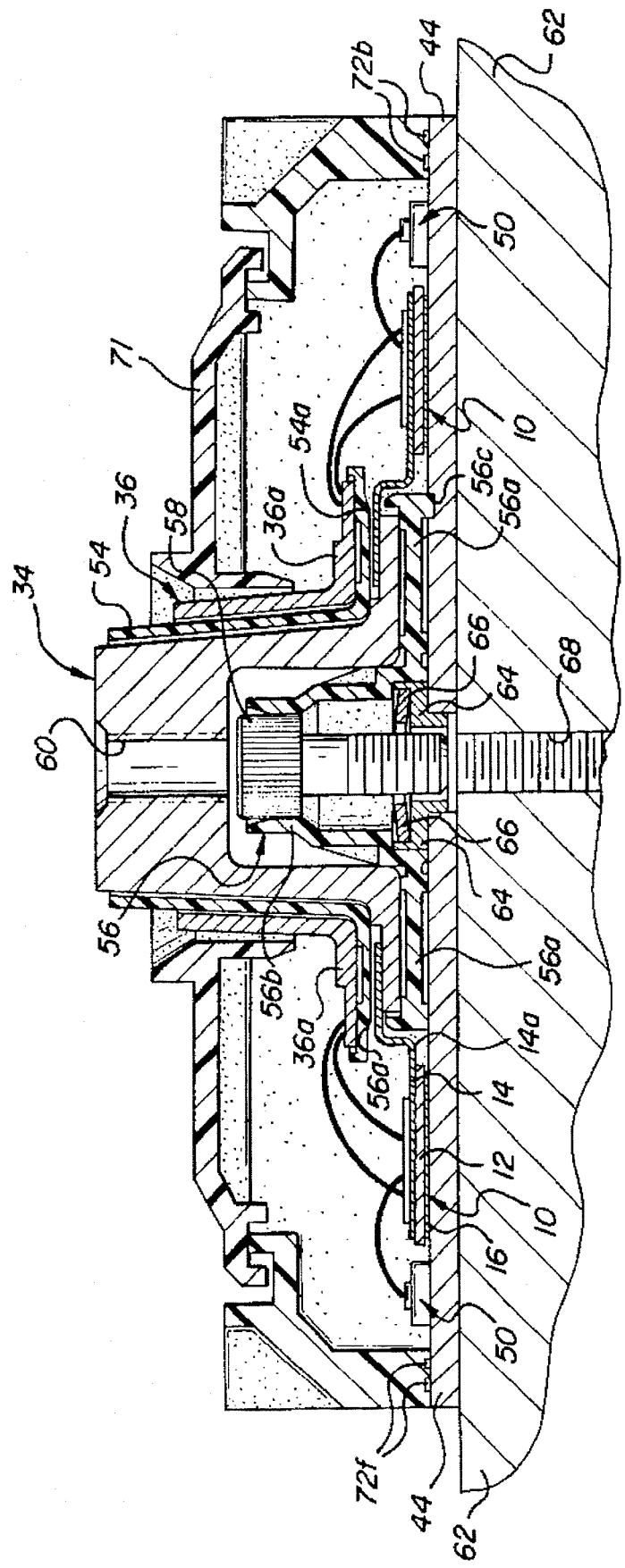
FIG. 12 shows a fragmentary cross-sectional and elevational view along the line 12—12 of FIG. 6.
Figure 13:
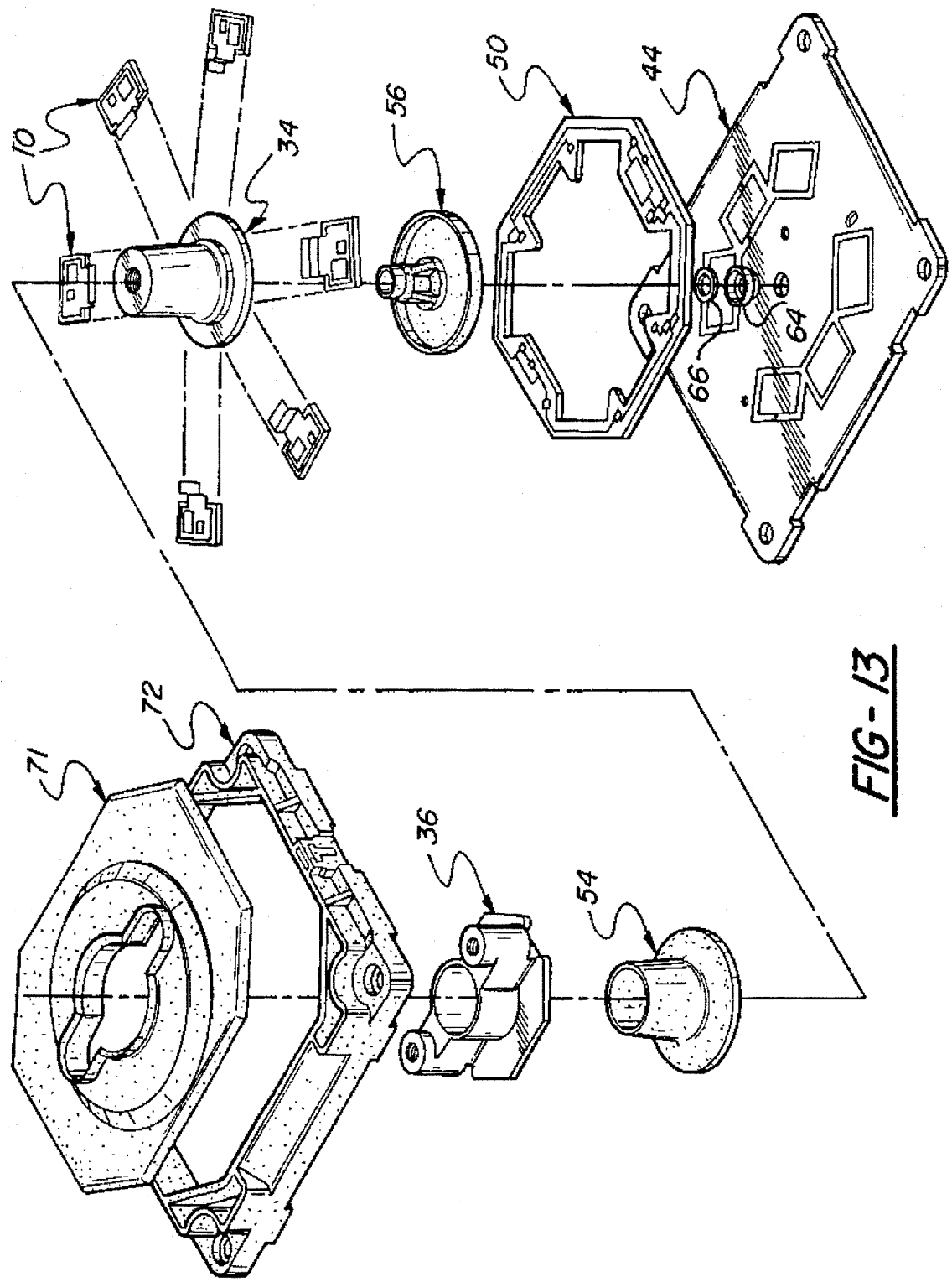
FIG. 13 shows an exploded isometric view of the module shown in connection with FIGS. 6–13.

Center mounting bolt 58 is trapped within a center recess within terminal 34. Bushing 64 is nested in a recess of the baseplate and encircles the threaded lower portion of 58. Bushing 64 has a shoulder on its upper periphery that locates a belleville spring washer 66, which also encircles the threaded lower portion of bolt 58. Heatsink 62 has threaded bores 68 for receiving bolts 58 and 70. The head of bolt 58 is frictionally retained within the upper portion 56b of tubular spacer 56 for shipment. The head of bolt 58 is adapted to cooperate with a tool such as an allen wrench through threaded central bore 60 in terminal 34. Bolt 58 would be pushed down from frictional engagement with the top 56b of spacer 56 into engagement with a threaded bore 68 in heat sink 62. The head of bolt 58 engages the spring washer 66. Spring washer 66 helps maintain a constant pressure between the baseplate 44 and heat sink 62 during thermal cycling, without inducing too much mechanical stress between them. It can be seen that the four corners of the housing are also bolted down. FIG. 12 shows one of the corner bolts 70 and its encircling spring washer 66. As with bolt 58, the corner bolts 70 are disposed in recesses but only the spring washer 66 is trapped.

Testing after final assembly would be as hereinbefore described.

The foregoing detailed description of FIGS. 6–13 are of a single switch module. In such a module all of the substrate subassemblies 10 are connected to terminal 34. Hence, the collectors of all transistors 18 are tied together at terminal 34. In addition, the emitters of all transistors 18 are electrically parallelled by their connection to terminal 36. Accordingly, the switch comprised by the module of FIGS. 6–13 would be functionally equivalent to the switch identified by reference numeral 42 between nodes 34 and 36 in the circuit diagram of FIG. 3. However, if possible and if appropriate matching can be arranged, it would be desirable to combine the switch between nodes 34 and 36 of FIG. 3 with the switch between nodes 36 and 37 of FIG. 3. Combining two single switches in one module is referred to herein as a double switch module. In such instance, the two switches would have a common Collector/emitter terminal, as for example at node 36 in FIG. 3.

A linear form of a double, or dual, switch is shown in FIGS. 14–20 of this application. However, the double, or dual, switch can also be made into a circular form. A circular form of the double, or dual, switch is U.S. patent application Ser. No. 08/278,199.

FIGS. 14–20 show six transistor/diode pairs. However, one can see that six pairs of transistors and diodes are divided into two groups of three pairs each. In FIGS. 6–13, all six pairs are grouped together in one switch. In FIGS. 14–20, the six transistor/diode pairs are divided into two groups. The three pairs of each group are electrically in parallel, and form one switch, analogous to all six pairs in FIGS. 6–13. Analogous to the single switch module, the transistors and diodes in each group are initially tested and sorted before mounting on their discrete substrates. After mounting, each transistor/diode pair is tested and sorted as a pair. Similar pairs are then matched and placed in three member groups. Accordingly, output characteristics of each substrate, i.e., mounted pair, in each group will be substantially the same, to provide the symmetry discussed in connection with the single switch of FIGS. 6–13. In addition, it is highly preferred that all the transistors in both groups be the same, to extend the symmetry even further.

In FIGS. 14–20, the Group I transistors 18*a*, 18*b* and 18*c* all have the same collector terminal 34, emitter terminal 36, gate terminal 30, collector kelvin 34*k* and emitter kelvin 36*k*. The Group II transistors 18*d*, 18*e* and 18*f* have collector leads 36*d*, 36*e* and 36*f*. It can been seen that the Group II collector leads 74*d*, 74*e*, and 74*f* are connected to the same bus 36*g*/76*g* as the Group I emitter leads 36*a*, 36*b* and 36*c*. Accordingly, terminal 36/74 functions as an emitter terminal for the Group I transistors, and as a collector terminal for the Group II transistors.

The emitter leads 76*d*, 76*e* and 76*f* for the Group II transistors have their own bus 76*g*, which is connected to the Group II transistor emitter terminal 76. Emitter terminal 76 is labeled E2 in FIGS. 14–20. Since it is intended that the transistors in Group I will be in the "on" condition when the transistors in Group II are in the "off" condition, and vice versa, a separate gate control electrode is needed for each group. Accordingly, the Group II transistors have their own gate terminal 78, gate bus 78*g* and gate leads 78*d*, 78*e* and 78*f*.

In order to match the transistors in each group, each of them has a laser trimmable variable resistance 32*d*, 32*e* and 32*f* in series with their respective gate conductors. Analogously, separate emitter and collector kelvin electrodes 76*k* and 74*k* are provided for the Group II electrodes.

The principles of chemical, mechanical, and electrical symmetry of this invention were hereinbefore described in connection with a circular structure. Such principles can also be applied to a linear structure, as for example the module of FIGS. 14–20. Moreover, they can be used to form a low inductance module that contains more than one switch. FIGS. 14–20 show a structure with only one pair of switches. On the other hand, is expected that this invention can be used to form low inductance switching modules with more than one pair of switches.

FIGS. 14–20 are included in this description to illustrate how the important principles of this invention, and of chemical, mechanical and geometrical symmetry, can be applied to a module of linear design, and how this invention simplifies its construction sufficiently to make it commercially manufacturable. To emphasize both the similarities and the differences between the circular single switch of FIGS. 6–13 and the linear double switch of FIGS. 14–20 similar components are given similar reference numerals. New elements in FIGS. 14–20 are given new reference numerals. For example, on the top half of FIGS. 14–17 have the same reference numerals as those shown on the left in FIGS. 6–8. However, on the bottom half of FIGS. 14–17 the reference numerals for the interconnection of the various components have new numerals representing that these are new and additional distinct interconnections. The reason for this is that the three substrate subassemblies on the top form one switch in FIGS. 14–17, while the substrate subassemblies 10 on the bottom comprise the second switch.

In the linear construction shown in FIGS. 14–20, the aforementioned input and output terminal parallelism and overlap are extensively used. For example, input and output conductors 34*g* and 36*g* for the first switch take the form of generally registered overlapping parallel plates (shown at the top of each of FIGS. 14–17). Similarly, input and output conductors for the second switch take the form of substantially registered overlapping parallel plates 74*g* and 76*g* (shown at the bottom of each of FIGS. 14–17). Because of such symmetry and overlap, input and output inductances in both switches are effectively canceled, or neutralized.

Figure 14:
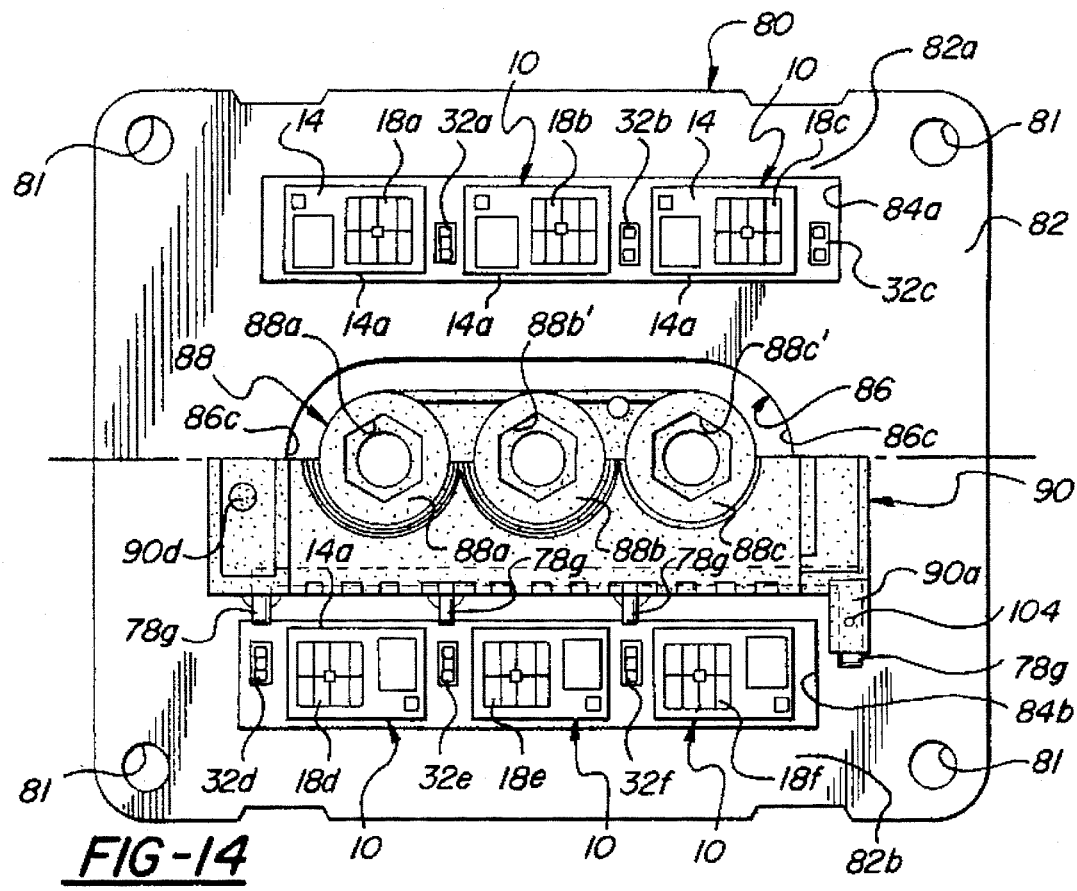
FIG. 14 shows a plan top view (with part broken away) of a linear/type dual switch module in an early stage of assembly and showing two linear groups of transistor substrates.

Reference is now made specifically to FIG. 14, which shows a plan view, with the upper part of the figure broken away. FIG. 14 shows a linear type, double switch module in an early stage of assembly. The module has a generally annular baseplate 80, which has a flat annular upper surface 82, that has a generally rectangular outer periphery. Baseplate 80 has an apertures 81 in each of its four corners, to receive mounting bolts (not shown). The mounting bolts are used to clamp baseplate 80 to a support (not shown). As can better be seen in FIGS. 18–19, baseplate 80 is hollow, and liquid cooled. Its support thus does not have to be a heat sink, such as heat sink 62 in the earlier embodiment of this invention. More will be said about liquid cooling of the baseplate later, in connection with the description of FIGS. 18 and 19.

The inner periphery of baseplate surface 82 is formed by an elongated central slot 86. Slot 86 has two parallel long sides 86*a* and 86*b*, and is symmetrically rounded at its opposed ends 86*c*, similar to the outer periphery of a horse race track. This results in two parallel elongated portions 82*a* and 82*b* of surface 82, spaced symmetrically by the slot. Each of the elongated surface portions 82*a* and 82*b* has an elongated rectangular region, respectively designated as 84*a* and 84*b*. Elongated rectangular regions 84*a* and 84*b* are symmetrically disposed with respect to one another on parallel surface portions 82*a* and 82*b*. Hence, the rate of cooling in corresponding parts will be similar. In addition, surface portions 84*a* and 84*b* are especially prepared to receive substrate subassemblies 10 and thick film resistor chips 32*a*–32*f*. By specially prepared, we mean that regions 84*a* and 84*b* are readily solderable, i.e., nickel plated, if substrate subassemblies 10 and/or chip resistor substrates 32*a*–32*f* are to be soldered in place. On the other hand, if they are to be adhesively bonded in place, baseplate surface portions 84*a* and 84*b* are especially prepared, i.e., etched and/or micro-roughened to aid in adhesion.

The substrate subassemblies 10 and chip resistor substrates 32*a*–32*f* are preferably the same as described in the preceding example of the invention. This would include a metallized lower surface that permits soldering to the baseplate surface portions 84*a* and 84*b* as shown. Chip resistor substrates 32*a*–32*f* would each be of ceramic, having a thick film cermet resistor coating in the middle of its upper surface and a connecting thick film cermet noble metal coating on each end. Substrate subassemblies 10 would be as hereinbefore described in connection with FIGS. 1–14.

Substrate subassemblies 10 would be tested and graded before mounting on baseplate 80, as hereinbefore described in connection with FIGS. 1–5, and also with the coaxial module of FIGS. 6–14. In the instant linear dual switch module of FIGS. 14–20, all substrate subassemblies 10 come from the same performance group. It is emphasized that the substrate subassemblies for both switches, not just for any one switch, of the module come from the same performance group into which the substrate subassemblies were sorted in FIG. 5. Hence, one starts out with similar substrate subassemblies for both switches. In addition, the module is symmetrical in its design, and the same assembly steps are used for both switches. Hence, the performance of both switches after final assembly is completed should be quite similar.

FIG. 14 shows the substrate subassemblies 10 after they are mounted on the baseplate 80. Substrate subassembly tab 14a is not shown in FIG. 14 because it is of thin metal, and is bent straight up in this view, perpendicular to surface 82, as the tabs 14a and 132a are shown in FIG. 25. The bend is shown to be precisely at the edge of the substrate in FIGS. 14–20. On the other hand, it need not be that way. One may prefer the first bend to be more like it is shown FIG. 1.

Three substrate subassemblies 10 are soldered to surface portion 84a, and three more to surface portion 84b. Each group of three is along a line parallel to the centerline of slot 86, and spaced the same distance from it. The chip resistors 32a–32f are disposed as shown. Preferably they are also disposed symmetrically to obtain uniformity in cooling, and thereby uniformity in temperature during operation. Maintaining such uniformity in temperature is important because resistors can change resistance with temperature. In this module resistor chips 32a–32f are present to provide uniform gate voltage to the transistors on substrate subassemblies 10. If resistor chips 32a–32 f do not provide an appropriate resistance change, gate voltage will vary among the transistors, producing a loss in the intended symmetry that this invention provides. As shown, transistors 18a–18c are disposed on the substrate subassemblies 10 along the upper part of FIGS. 14–17. Transistors 18d–18f are disposed on the substrate subassemblies 10 along the lower part of those Figures.

A first plastic spacer 90 is disposed on baseplate surface 82, between the two rows of substrate subassemblies 10. First plastic spacer 90 is of electrically nonconductive plastic, as is all the rest of the plastic elements to be described in this module of the invention. First plastic spacer 90 is a generally plate-like rectangular member that has many added conformations. One of the conformations is an annular wall-like projection 90e on its lower surface. The wall-like projection 90e nests within slot 86. Projection 90e locates first plastic spacer 90 on surface 82, with respect to the elongated rectangular surface portions 84a and 84b. Nested within the wall-like projection 90e, and adhesively bonded thereto, is a complex plastic molding 88. Complex plastic molding 88 has three cylindrical projections 88a, 88b and 88c, uniformly spaced along the centerline of the length of the slot. Cylindrical projections 88a, 88b and 88c, respectively, have hexagonal recesses 88a', 88b' and 88c', within which clamping nuts 89 are disposed and adhesively bonded. For ease of illustration, the adhesive is not shown. For analogous reasons, it is not shown in any other parts of FIGS. 14–20 either. The same silicone adhesive as described for the earlier embodiment of this invention can be used for the adhesive in this embodiment too.

The lower surface of first plastic spacer 90, outside of annular projection 90e, is flat and rests on the underlying portion of baseplate surface 82. The two are adhesively bonded together.

First plastic spacer 90 contains a first linear lead frame element 30g and a second linear lead frame element 78g. Both linear lead frame elements are shown in phantom lines in FIG. 16. It should be mentioned that FIG. 16 also shows a second plastic spacer overlying the first plastic spacer. It is not intended that the phantom lines should indicate that the lead frame is in the second plastic spacer. It is made of record here that nothing is embedded in the second plastic spacer. Hence, it contains no embedded lead frame.

The first embedded lead frame element 30g in the first plastic spacer 90 serves as a gate bus for the first group of transistors 18a, 18b and 18c. The second linear bus 78g serves as a second gate bus for the transistors 18d, 18e and 18f. The upper part of spacer 90 is broken away in FIG. 14. However, first plastic spacer 90 can be seen in its entirety in FIG. 15, along with the exposed parts of the two embedded lead frames. One can see that there are exposed portions of lead frame 30g opposite the resistor chips 32a, 32b and 32c, as well as in extension 90a. The second lead frame 78g is embedded along the opposite edge of first plastic spacer 90. Lead frame 78g has free end portions exposed opposite resistor chips 32d, 32e and 32f. It also has a portion embedded within extension 90b, which is diametrically opposed from the first spacer extension 90a.

Spacer 90 has a plurality of additional conformations. These additional conformations serve to locate subsequently assembled components, such as the terminal plates 34g and 74g, and an overlying second plastic spacer 92.

Disposed in the same plane on the first plastic spacer 90 are two metal plates 34g and 74g. They each have a linear edge facing the substrate subassemblies they serve, and a large semicircular enlargement. The enlargement on terminal plate 74g is central to the length of the plate. The enlargement on terminal plate 34g is at one end. The two enlargements nest together, separated by a narrow short wall 90c on spacer 90. Part of the enlargement in terminal plate 34g is obscured in FIG. 15 by a cylindrical terminal boss 34. Terminal plates 34g and 74g, and boss 34 are of nickel-plated copper, as are the other terminal plates 36g and 76g and terminal bosses 36/74 and 76. The terminal bosses 34, 36/74 and 76 each have a central bore to receive a bolt 94. Bolt 94 cooperates with a nut 89 in recess 88a' of plastic molding 88 to clamp terminal 76g against baseplate 80. As hereinbefore indicated, the clamping nut 89 would be adhesively bonded within the recess 88a'.

Figure 15:
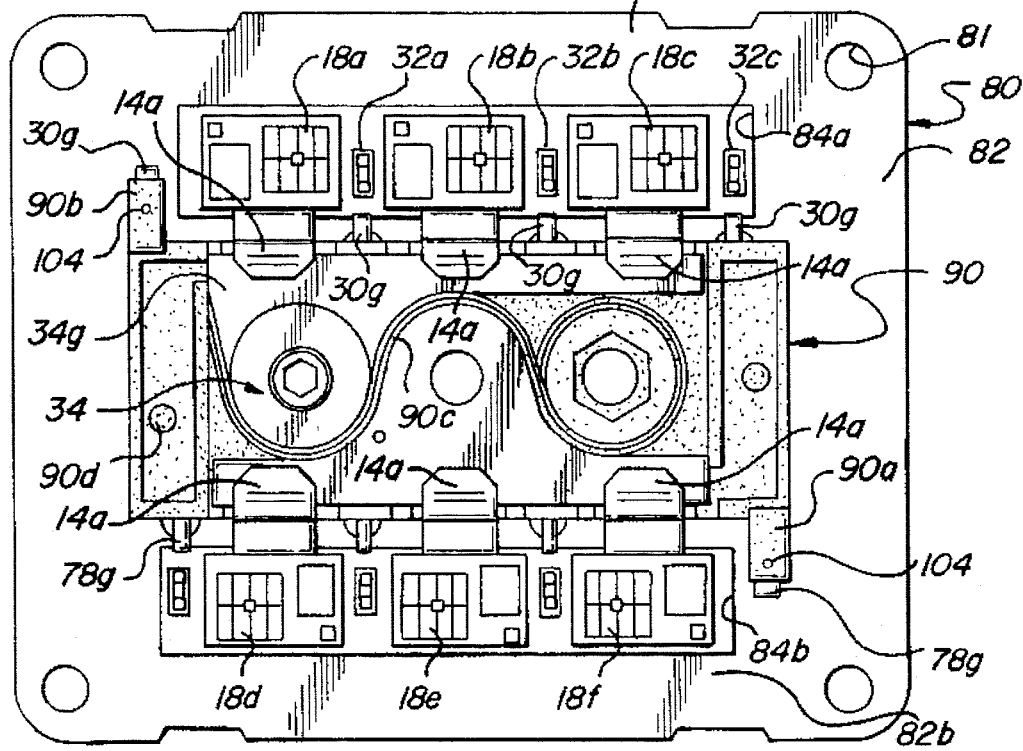
FIG. 15 shows a top plan view of the linear type dual switch module shown in FIG. 14 but in a next following stage of assembly, where the two groups of substrates are connected to their respective terminal plates.

It should also be noticed that in FIG. 15, substrate tabs 14a have now been bent down over their respective terminal plates 34g and 74g. Tabs 14a, therefore have two right angle bends, as does the substrate tab 14a in FIG. 1. Each of the portions at tabs 14a that overlie their respective terminal plates 34g and 74g are electron or laser beam welded to those terminal plates. The weld takes the form of two linear weld strips on each tab. However, if desired, tabs 14a can each be soldered to their respective terminal plates 34g and 74g.

As previously indicated, the conformations on the plastic spacer 90 aid in positioning terminal plate members 34g and 74g with respect to each other and with respect to the tabs 14a. In addition, it should be mentioned that first plastic spacer 90 has an upstanding boss 90d on its left and right edges. These bosses nest in cooperating recesses 92b in the second plastic spacer 92, as can be seen in FIG. 16.

Figure 16:
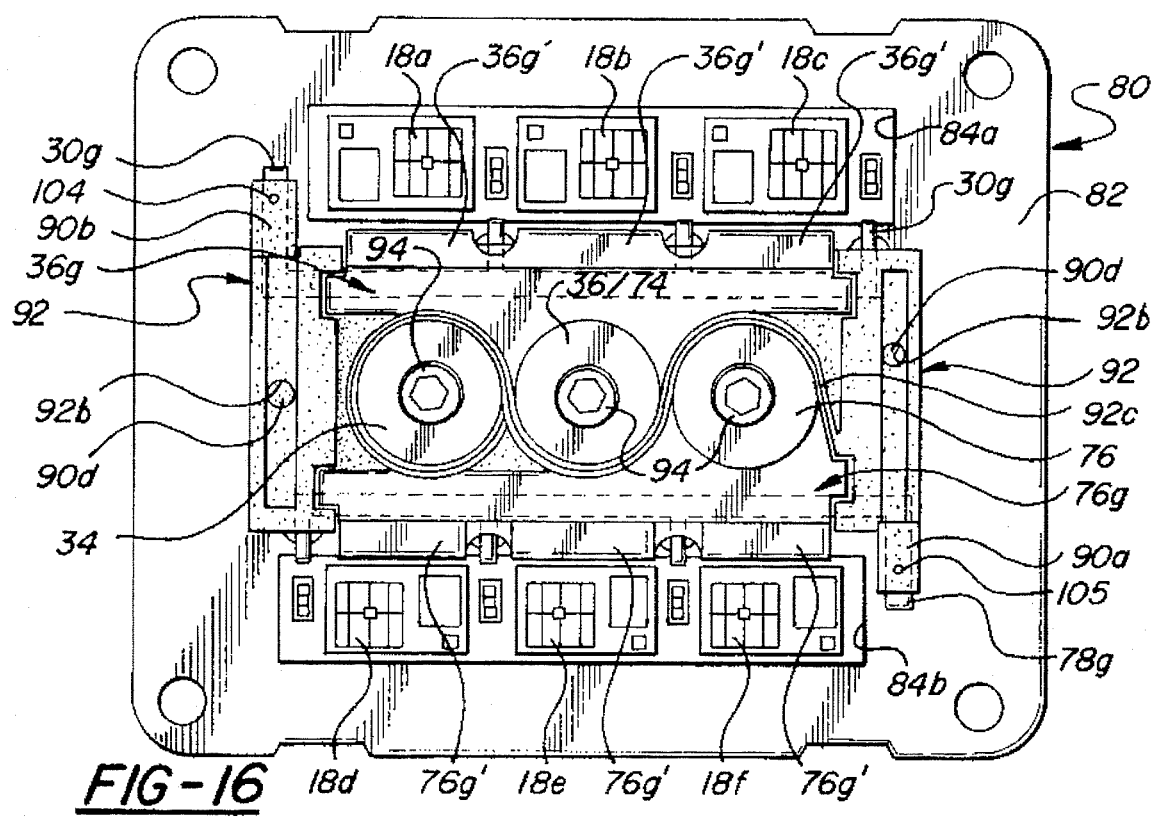
FIG. 16 shows a top plan view of the module of FIG. 15 in a still later stage of assembly, where a second spacer and two more terminal plates have been added.

As can also be seen in FIG. 16, second plastic spacer 92 is a generally plate-like rectangular molded body having alignment conformations. Terminal plates 36g and 76g are disposed on second plastic spacer 92. They are coplanar with each other but respectively aligned over the lower plates 34g and 74g. A short wall 92c helps respectively align terminal plates 36g and 76g over the terminal plates 34g and 74g, so that they are in substantial overlapping relationship. The wall 92c in the second plastic spacer 92 is thus analogous to wall 90c in the first plastic spacer 90. It will be noticed from FIG. 16 that the upper pair of terminal plates 36g and 76g are almost mirror images of the lower pair of terminal plates 34g and 74g. However, the upper pair of plates have extensions at their ends that nest in conformations on the upper surface of second plastic spacer 92. In addition it should be noticed that the longitudinal edge of each of the upper terminal plates 36g and 76g, has two notches, that are respectively located over exposed portions of the lead frames 30g and 78g in the first plastic spacer. Hence, the notches in terminal plate 36g are opposite resistor chips 32b and 32c. The notches in terminal plate 76g are opposite resistor chips 32e and 32f.

In addition, spaced by the notches on the linear edge of terminal plate 36g, are three rectangular aluminum laminations 36g'. Aluminum laminations 36g' enhance bondability of filamentary aluminum wires between terminal member 36g and the respective aluminum metallizations forming gate electrodes on transistors 18a, 18b and 18c. For the same reasons, terminal plate 76g has three rectangular aluminum laminations 76g' along its notched linear edge. The aluminum laminations can be formed in any convenient manner and form no part of this invention.

It can be see the semi-circular enlargement of upper terminal plate 74 overlies the semi-circular enlargement of terminal plate 36. The central bores in these overlapping plate portions are registered. Nickel plated copper washers, of a combined thickness equal to that of the second plastic spacer, are disposed between the overlying semi-circular portions of terminal plates 36g and 74g. FIG. 16 further shows cylindrical terminal boss 36/74 in register with these bores and the combination clamped together by a bolt 94 and a nut 89. It can be understood then that terminal 36/74 forms a common electrical contact, or circuit node, as indicated at 36 in FIG. 3. Terminal boss 46/74, then, forms an emitter terminal for first switch transistors 18a, 18b and 18c and a collector terminal for the second switch transistors 18d, 18e and 18f. The cylindrical terminal boss 76 is analogously clamped to terminal plate 76g, by means of bolt 94, and forms an emitter terminal for the second switch transistors 18d, 18e and 18f. If desired, washers can be used under the terminal plates or under their terminal cylinder bosses to adjust top surface height of the cylinders to match any corresponding connector system that might be employed. In such instance, a common cylinder size could be used for all terminals. It should be mentioned that it may be preferred adhesively bond the lower pair of coplanar plates to first plastic spacer, adhesively bond the second plastic spacer to the them and/or the first plastic spacer, and to adhesively bond the second pair of coplanar plates to the to second plastic spacer. Alternatively, and ultimately most preferably, the plates, spacers and washers (if any needed) would all be insert molded into a single metal/plastic composite part. This would be the simplest construction of all, and probably the most economical and reliable.

In addition, an insert molded metal/plastic composite part is already being designed that has all of the plate weld locations coplanar. A composite part with coplanar plate weld locations allows improved use of our improved five layer substrate subassembly 10'. One could make the two terminal weld tabs 14a and 132a of our five layer substrate assembly coplanar. Then, welding of the substrate subassembly terminal weld tabs 14a and 132a to the terminal plate contact areas could be done in a single operation. This is analogous to what was indicated above in connection with U.S. patent application Ser. No. 08/278,199. This will probably be preferred over assembly described herein, which has a "wire bonded" input terminal connection. It will probably be preferred because more elements are integrated and pre-testable. Moreover, it should be repeated that our five layer substrate subassembly 10' is easily testable at full power. Accordingly, we would favor its use even if the terminal weld tabs 14a and 132a were not coplanar, and two terminal plate/tab welding operations were needed.

Figure 17:
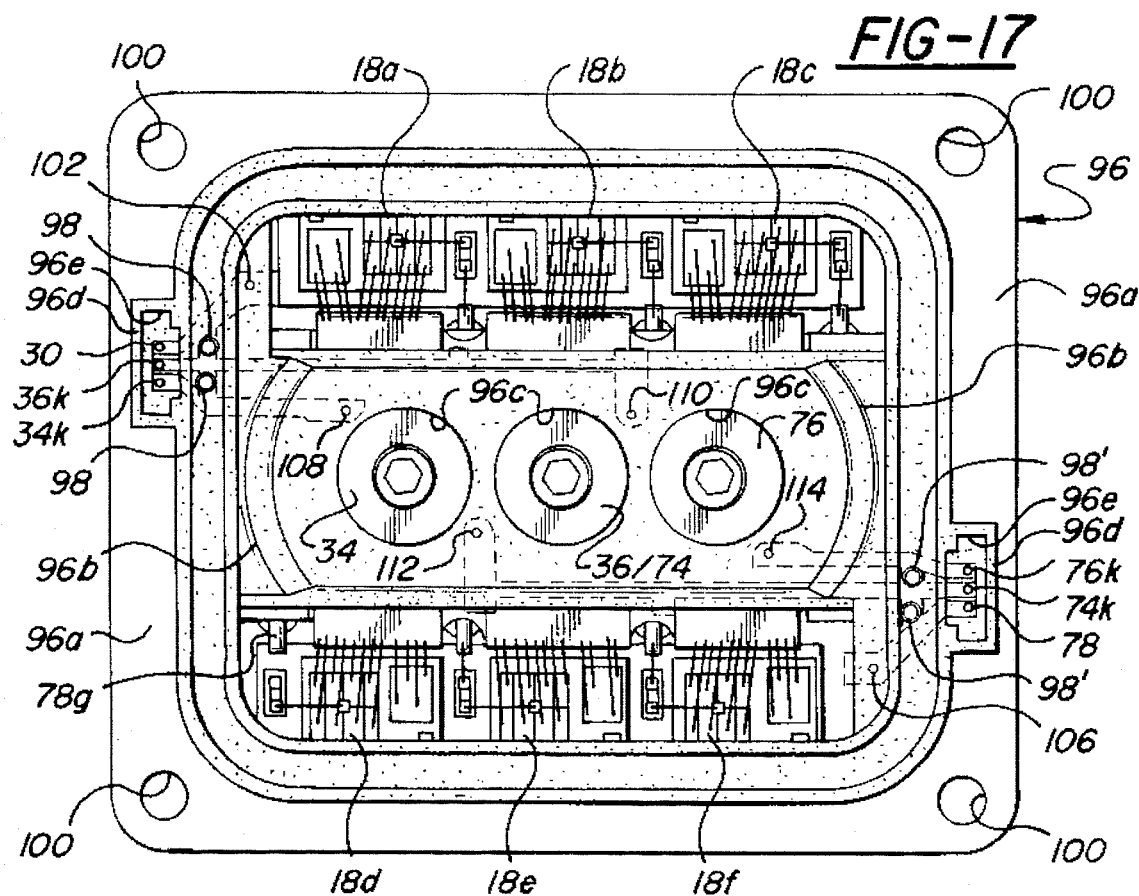
FIG. 17 shows a top plan view of the module of FIG. 16 with housing and wire bonds added.

In the instant embodiment of the invention, once the upper coplanar terminal plates 36g and 74g are in place, "wire bonding" can proceed. Relatively thick filamentary aluminum wire would be thermocompression and/or ultrasonically bonded. The wires would extend between the aluminized portions of the terminal plates and the semiconductor devices on the substrates, as shown. They would also extend from the exposed parts of gate bus 30g to resistor chips 32a, 32b and 32c. They would extend from the exposed parts of gate bus 78g to resistor chips 32d, 32e and 32f. From resistor chips 32a–32 f, the aluminum wire would respectively extend to the aluminum-coated gate electrode on transistors 18a–18f. As hereinbefore indicated, relatively thick filamentary aluminum wire is used. However, as shown in FIG. 17, multiple strands of such wires is used in the transistor and diode large area contacts, in order to handle the high current at low resistance. The multiplicity of wires on the transistors, as previously indicated also tend to improve fatigue life of the bonds for the wires connected to the transistors.

It should be mentioned that geometrical symmetry can be provided even more readily in the linear type of module than in the concentric type of module. It should also be seen that in the linear module the lengths of filamentary wire between the transistors and the terminals extend over tabs 14a. This provides current flow in an opposite but parallel direction. As previously indicated, this tends to further negate input/output inductance.

While not shown in the drawing, the module can be tested and sorted after "wire bonding" and before the housing 96 has been bonded to baseplate 80. This would be analogous to the testing of the coaxial module as shown in FIGS. 9 and 10. However, since baseplate 80 is hollow, it has its own cooling means. One should connect the input and output ports 120 and 128 to a source of coolant for testing at substantial power for any period of time. As previously indicated for FIGS. 9 and 10, repair is easily done at this stage of assembly. On the other hand, if assembly yields are high enough, one may choose to delay testing until housing 96 is bonded and its lead frames interconnected, or until final assembly is completed. This is similar to the foregoing discussion in connection with testing of the embodiment shown in FIGS. 6–13.

Reference is now made to FIG. 17 which shows a housing 96 registered over baseplate 80 and adhesively bonded to baseplate upper surface 82. Housing 96 is of nonconductive plastic and has a ring-like outer portion 96a and a center bridge portion 96b. The center bridge portion 96b has three apertures 96c to accommodate the terminal posts, i.e., bosses, 34, 36/74, and 76. The left side of housing ring 96a has an enlargement 96d that contains a recess 96e within which are disposed terminal tabs 30, 36k and 34k. Analogously, the right side of housing ring 96a has an enlargement 96d'. Enlargement 96d' has a recess 96e' within which are exposed terminal tabs 76k, 74k and 78. The terminal tabs 30, 36k and 34k are exposed ends of a lead frame that is embedded within the housing 96 to form electrical connections with various parts of the assembly at different levels and locations beneath the cover 96. The two embedded lead frames are shown in FIG. 17 in phantom lines. As can be seen, they are similar in configuration but oppositely disposed.

Each lead frame can be made a part of the housing by insert molding of the housing. In such instance, after molding, the various interconnecting portions of the lead frame are removed, to release the individual parts of the lead frame. The exposed portions can be removed by cutting or stamping, as is usual. In this embodiment of the invention, each of the two lead frames includes two webbed portions under the rim 96*a*. The webbed portions are removed by drilling holes 98 down through the housing plastic, and down further through the interconnecting webbed portions. This produces a final separation between the various leads 30, 36*k* and 34*k* on the left of FIG. 17. Analogously, holes 98' are drilled through the right edge of the housing ring 96*a* down through the connecting webbed portion between terminal members 76*k*, 74*k* and 78. The drilled holes separates the lead frame into three discrete electrically isolated terminals. After the holes 98 and 98' have been drilled, and the respective electrodes separated, the holes can be filled with any suitable material, as for example the same adhesive used to bond the housing 96 to the baseplate 80.

It should also be mentioned that the housing ring portion 96*a* has holes 100 in its four quarters corresponding to the holes 81 in the four corners of baseplate 80. When cover 96 is bonded to baseplate 80 these holes are left open so that bolts (not shown) can be used to clamp the resultant assembly to a support (not shown).

While not previously mentioned, the first plastic spacer 90 has tiny apertures 104 in its opposed extensions 90*a* and 90*b*. These apertures extend down into the thickness of plastic spacer 96 and register with corresponding holes in the embedded lead frame assemblies 30*g* and 78*g*. It can also be seen in FIG. 15 that terminal plates 34*g* and 74*g* have similar small apertures. FIG. 16 shows small apertures in each of the terminal plates 36*g* and 76*g*. Referring now to FIG. 17, aperture 102 in the housing 96 intersects an aperture (not separately shown) in first lead frame element 30 that is embedded in the housing 96. Aperture 102 is the same diameter as, and registers with, the aperture in the first lead frame 30 embedded in housing 96. Aperture 102 is also registered over aperture 104 in lower spacer extension 90*b*. Tiny aperture 106 in the lower right-hand corner of lead frame 96 intersects an aperture (not separately shown) in second lead frame element 78 that is embedded in the housing 96. Aperture 106 is the same diameter as, and registers with, the aperture in the second lead frame 78 embedded in housing 96. Aperture 106 is also registered over aperture is in register with the aperture 105 in the lower spacer extension 90*a*. Pins (not separately shown) are driven down through each set of registered apertures and through the associated overlapping portions of each pair of embedded lead frames. The pins rectangular in cross-section and hardened, so that they can be can be hammered or pressed down. To insure a permanent contact, the diagonal dimension of the cross-section of the pins is about 5–25% bigger than the diameter of the apertures. Much bigger than that may make it difficult to drive the pins down into the second lead frame. The length of the pins is slightly longer than will extend from the surface of housing 96 and through the second lead frame (which is embedded in the first plastic spacer). One pin thus provides electrical contact between exposed contact 30 and the gate bus 30*g* for transistors 18*a*, 18*b* and 18*c*, via apertures 102 and 104. Analogously, a pin driven through apertures 106 and 105 provides an electrical communication between the gate terminal tab 78 and the lead frame 78*g* for transistors 18*d*, 18*e* and 18*f*. As mentioned above, the chip resistors 32*a*–32*c* and 32*d*–32*f* were previously connected by filamentary wires to their respective lead frames 30*g* and 78*g*, and also connected by filamentary wires to the gate electrodes of their respective transistors. Accordingly, the chip resistors 32*a*–32 *f* can be trimmed so that a predetermined gate potential can be applied to transistors 18*a*–18*f*. Presumably, the predetermined voltage is the same voltage for all transistors. However, it should be recognized that equal potential is intended to provide equal performance. It is conceivable that in some instances, a different potential may be desired for some or all of the transistors 18*a*–8*f*, in order to obtain equal performance. For example a given transistor may need more gate voltage to reach the same operating level as the other transistors.

Kelvin connections have not yet been described for this embodiment of the invention. They are provided from the housing lead frame using a driven-pin type of connection, such as described in the preceding paragraph. They are provided by driving a pin, that is rectangular in cross-section and hardened, into the other apertures in the housing. This connects selected discrete members of the housing leads to selected terminal members. For example, aperture 108 extends through a housing lead frame member and is registered over an aperture terminal plate 36*g*. Driving the aforementioned type of pin down through these apertures will interconnect terminal tab 34*k* with terminal plate 34*g*. A pin driven down through aperture 110, connects contact tab with and terminal plate 36*g*. A pin driven down through aperture 112, connects contact tab 74*k* with terminal plate 74*g*. A pin driven down through aperture 114 connects contact tab 76*k* with terminal plate 76*g*. Once the pins have all been driven in, the apertures can be sealed. Adhesive can be used. Then, the chamber formed by housing 96 and baseplate 80 can be filled with a silicone resin or oil, if desired. The filling is not shown because it is optional, and well known. Moreover, showing it would tend to obscure the new and different important features of the invention.

A cover 116, made of nonconductive plastic or the like, is then placed over the housing 96. The outer periphery of cover 116 nests within a circumferential groove in housing 96. An adhesive (not shown) is disposed in the circumferential groove 118 to bond cover 116 to housing 96. Housing 116 has apertures 116*a* corresponding to and in register with the apertures 96*c* in the housing bridge portion 96*b*. Apertures 116*a* are in register with the apertures 96*c* in the bridge portion 96*b* of housing 96, to accommodate the terminal bosses 34, 36/74 and 76.

FIGS. 18 and 19 are respectively width and length centerline cross-sectional views of the completed device. To better emphasize the difference between plastic and metal in these views, plastic is shown with traditional cross-sectioning. Metal is not. In addition, some of the metal elements are shown in elevation. For example, the clamping nuts 89 are shown in elevation in FIGS. 18 and 19.

Baseplate 80 is the same composite material as used for baseplate 62 in the single switch of FIGS. 6–13. However, in this embodiment of the invention, baseplate 80 is hollow. In addition, its interior contains cylindrical post-portions 118 extending between upper and lower interior surfaces of the hollow baseplate 80. The interior posts 118 are disposed in a uniform array to enhance heat transfer between substrate 80 and a coolant fluid that passed through the baseplate 80. The cooling fluid enters the interior 122 of baseplate 118 through an entrance duct 120. Interior 122 is at one end of the length of the baseplate and interconnects with two interior portions 124 of the baseplate. Interior portions 124 are disposed on either side of slot 86. The other ends of baseplate interior portions 124 communicate with the interior portion 126 at the other end of the baseplate. Interior portion 126 connects with an outlet port 128.

As previously mentioned, it is important that cooling of all the devices be similar to obtain similarity in electrical operation. Accordingly, the design and arrangement of the columns 118 is the same on both sides of the baseplate aperture 86. Analogously, the flow of cooling fluid from inlet 120 to outlet 128 is designed to be similar on both sides of slot 86. If the cooling is similar, electrical performance of the devices will more likely be similar.

Also, it can be seen in FIG. 17 that each of the exposed electrode tabs 30, 36k, 34k, 74k, 76k and 78 have small circular apertures in their exposed ends. We contemplate using pins having a rectangular, preferably square, cross-section as connectors to these tabs. To make connection with a given tab, the connector pin should have a diagonal dimension 5–10% greater than the diameter of the aperture into which it is to be driven. However, this difference may vary. This appears to make a pin-to tab bond that is permanent and stays low in electrical resistance. Accordingly, we believe that it is more than just a "press fit" connection. The bond may actually be a cold weld, especially if the pin is of copper. In any event, the connection is effectively permanent enough for the pins in tabs 30,34k and 36k and in 78 74k and 76k to be used as male connector elements. In such instance a short connector pin is driven through each such tab aperture into a cylindrical housing recess about the same diameter as the tab aperture. The length of the pins extending up from the tab preferably should not be much, if any, above the upper periphery of the surrounding housing portion 96d. The result is an integrated male connector assembly, for a for a push-on female connector assembly.

Reference is now made to the improved five layer substrate subassembly shown in FIGS. 21–25. FIG. 21 shows a substrate subassembly 10' that includes a one millimeter thick beryllium oxide wafer 12, and a bottom copper foil layer 16, similar to the substrate subassembly show in FIG. 1. For this reason they are identified by the same reference numerals. A copper foil layer 14 is bonded to the upper surface of the wafer 12, also similar to what is shown in FIG. 1, and for that reason is also identified by reference numeral 14. To this extent, substrate subassembly 10' is identical to the substrate subassembly 10 shown in FIG. 1.

In addition, in the substrate subassembly 10', copper foil layer 14 is not the top copper foil layer. It is a middle copper foil layer. The five layer substrate subassembly 10' of FIG. 21 also includes a second beryllium oxide wafer 130, that is highly contoured. It also includes copper foil layer 132 on top of the second beryllium oxide wafer 130. The top copper foil layer 132 is also highly contoured, to match the contours of second beryllium oxide wafer 130. However, it also includes a tab potion 132 a that is offset from tab 14a but is otherwise similar. The copper foil layers are direct copper bonded to the wafer surfaces that they contact, as with the substrate subassembly 10 shown in FIG. 1.

It is convenient and preferred at this time to make the upper ceramic layer 130 of a beryllium oxide wafer about one millimeter thick. However, it is to be recognized that while beryllium oxide of this thickness is preferred, wafer 130 need not necessarily be of this thickness and it may not necessarily be of beryllium oxide. In fact, it may not even necessarily have to be a discrete wafer, as will hereinafter be explained.

Our preferred substrate assembly 10' should have a thermal coefficient of expansion approaching that of silicon. That is why beryllium oxide is used for wafer 12. If the ceramic layer 130 is to be other than of beryllium oxide, we would prefer that the alternative ceramic material would have a thermal coefficient of expansion similar to that of beryllium oxide, i.e., similar to silicon. One such alternative material is aluminum oxide. Since this layer may not have as active a role in thermal transfer as lower ceramic layer 12, aluminum oxide might turn out to be quite satisfactory for layer 130. Other materials might work as well, depending on the application. Ceramic may not even have to be used, especially if the alternative material had a compatible coefficient of expansion with silicon. If not, we prefer that the alternative material be thin enough not to adversely affect the preferred coefficient of expansion of the resultant composite.

On the other hand, one also has to be concerned that the dielectric layer 130 be thick enough not to be detrimentally affected by "wire bonding". In our preferred embodiment, a switching transistor chip 18 is mounted on middle copper foil layer 14. We currently anticipate interconnecting surface regions of switching transistor chip 18 with top copper foil layer 132 by "wire bonded". In such instance, the ends of filamentary wires are going to be attached to the copper foil layer 132 over ceramic layer 130 by techniques that subject these layers to localized high pressures. Ceramic layer 130 can be a coating or a wafer. However, the coating or wafer has to be strong enough to withstand such bonding techniques. If dielectric layer 130 is a coating or wafer that is too thin, the "wire bonded" techniques can possibly fracture it, and cause an immediate, or subsequent, electrical short between copper foil layers 14 and 132. On the other hand, chip 18 might be interconnected to the upper conductor layer 132 by other techniques that do not subject dielectric layer 130 to such high localized pressures. For example chip 18 could be pre-bonded to inner ends of a convergent finger connector pattern, such as in tape automated bonding. The outer ends of the convergent fingers could be attached to top copper foil layer 132 by a lower pressure bonding technique, such as soldering or lower pressure thermocompression tape bonding. In such instance, it is conceivable that upper dielectric layer 130 could be formed of other materials, in other thicknesses, and by other techniques. In such instance, upper copper foil layer could be bonded to dielectric layer 130 by other techniques. It such further instance, upper copper layer 132 might integrate the convergent finger lead pattern. In any event, these alternative examples are given to illustrate that deviations might be possible from the preferred embodiments described herein, without departing from the spirit of the invention in our five layer substrate subassembly 10'.

As mentioned, upper ceramic layer 130 is highly contoured. It contains an aperture 130a which exposes a portion of copper foil layer 14. SFD chip 20 is soldered to this exposed portion of the copper foil layer 14. Analogously, windows 130b and 130c in ceramic layer 130 expose other portions of the copper foil layer 14. An IGBT chip 18 is soldered to copper foil 14 exposed within window 130b. Trimmable resistor chip 32 is soldered to the portion of copper foil layer 14 exposed within window 130c. It should also be mentioned that the corner of ceramic layer 130 is notched at 130d, which exposes a portion 14b of the copper foil layer 14. A wire bond pad 22 is soldered to copper foil portion 14b in the ceramic notch 130d. This bond pad is the same as described for FIG. 1, and is thus given the same reference numeral.

In the module example shown in FIGS. 6–13, the trimmable resistance 32 was disposed on annular circuit board member 50. In the module example shown in FIGS. 14–20, the trimmable resistance 32 is disposed directly on the baseplate 80. In both module examples, one end of the trimmable resistance was wire bonded to the central gate electrode 26 on transistor chip 18. In the improved substrate assembly 10' of FIG. 21, we choose to add the resistance element 32 directly to the substrate assembly. Wire bond lengths are shorter and more elements are integrated on the substrate assembly 10'. We chose to include the trimmable resistance 32 in the alternate five layer substrate subassembly 10" shown in FIG. 24 and the additional alternate embodiment of a five layer substrate assembly 10''' shown in FIG. 25. In all of these embodiments, the trimmable resistance is disposed on the same surface as the chip 18 for convenience of wire bonding.

"Wire bonds" are not shown in FIG. 21, to better show the remainder of the substrate subassembly 10'. "Wire bonds" are simplistically shown in FIG. 24 to avoid overcomplicating the illustration. On the other hand, the "wire bonds" are shown in perspective in FIG. 25. It should be understood that the substrate assembly 10' of FIG. 21 and 10" of FIG. 24 would actually have "wire bonds" that would be along the lines of those shown in FIG. 25.

Referring back to the trimmable resistance shown in substrate subassembly 10' of FIG. 21, it should be recognized that trimmable resistance, if desired, could be disposed on the upper copper foil layer 132. It is preferably on copper foil layer 14 to make its "wire bond" surfaces closer to the level of the surface of copper foil layer 132. Still further, one may choose not to include a trimmable resistance 32 at all in the substrate subassembly 10'. However, in most instances we believe it would be preferable to include the resistance element 32 in the substrate subassembly, so that it could be "wire bonded" to the central contact 26 on chip 18 while other "wire bonds" to chip 18 are being made. For example, as seen in FIG. 25, it may be desirable to bond some of the wires, then bond a wire between resistor chip 32 to the central contact 26 of transistor chip 18, and then finish bonding the rest of the wires between chip 18 and top copper foil layer 132. It may not be necessary to trim the resistor of resistor chip 32 to any particular value before testing the substrate of subassembly 10' before mount. One may choose to reserve this trim until after final assembly. In such instance, the end of the resistor on chip 32, to which the aforementioned "wire bond" is made, would be probed to supply operating gate voltage to gate contact 26 on transistor chip 18 during testing of substrate subassembly 10'.

Lower copper foil layer 14 has an extension or tab 14a similar to the tab 14a shown in FIG. 1. Upper copper foil layer 132 has an extension or tab 132a. The end of tab 14a is at a lower level than that of tab 132a so that they can contact terminal elements at different levels. However, as previously indicated, the ends of tabs 14a and 132a could be coplanar if the terminals they were to contact were coplanar. In either event, one can respectively clamp the separate input and output test terminals to the ends of tabs 14a and 132a to conveniently test the substrate subassembly 10' at full power.

As hereinbefore mentioned in connection with FIGS. 4 and 9, the substrate subassembly would have to be clamped to a cooling substrate for significant power testing. After such testing, of course, the substrate and subassemblies can be sorted in the manner indicated in FIG. 5. Such testing and sorting is obviously more precise if the substrate subassembly can be tested at full power. The manner in which the substrates subassembly 10' is clamped against the heat sink is not particularly important to this invention. Any technique for providing good thermal contact between the substrates of assembly 10' and the cooling element on which it is tested can be used.

Figure 22:
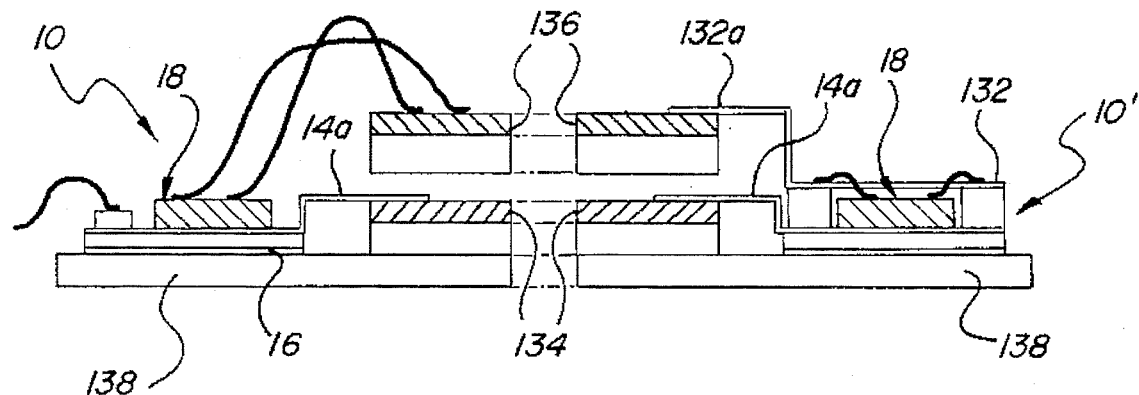
FIG. 22 schematically shows comparative side views illustrating connections of the substrate subassemblies of FIGS. 1 and 21 to overlapped terminal members.

FIG. 22 shows our five layer substrate subassembly in sectional view. It illustrates the difference between our three layer subassembly 10 (shown to the left of FIG. 22) and our improved five layer substrate subassembly 10' (shown to the right of FIG. 22). Chip 18 in substrate subassembly 10 is wire bonded to the upper terminal 136 in FIG. 22. On the other hand, chip 18 of the five layer substrate subassembly 10' is wire bonded to the upper copper layer 132. Tab 132a, in turn, is bonded to terminal 136. The lower tabs 14a on each of the three layer subassembly 10 and the five layer subassembly 10' are bonded to a lower terminal 134 in the same manner.

Figure 23:
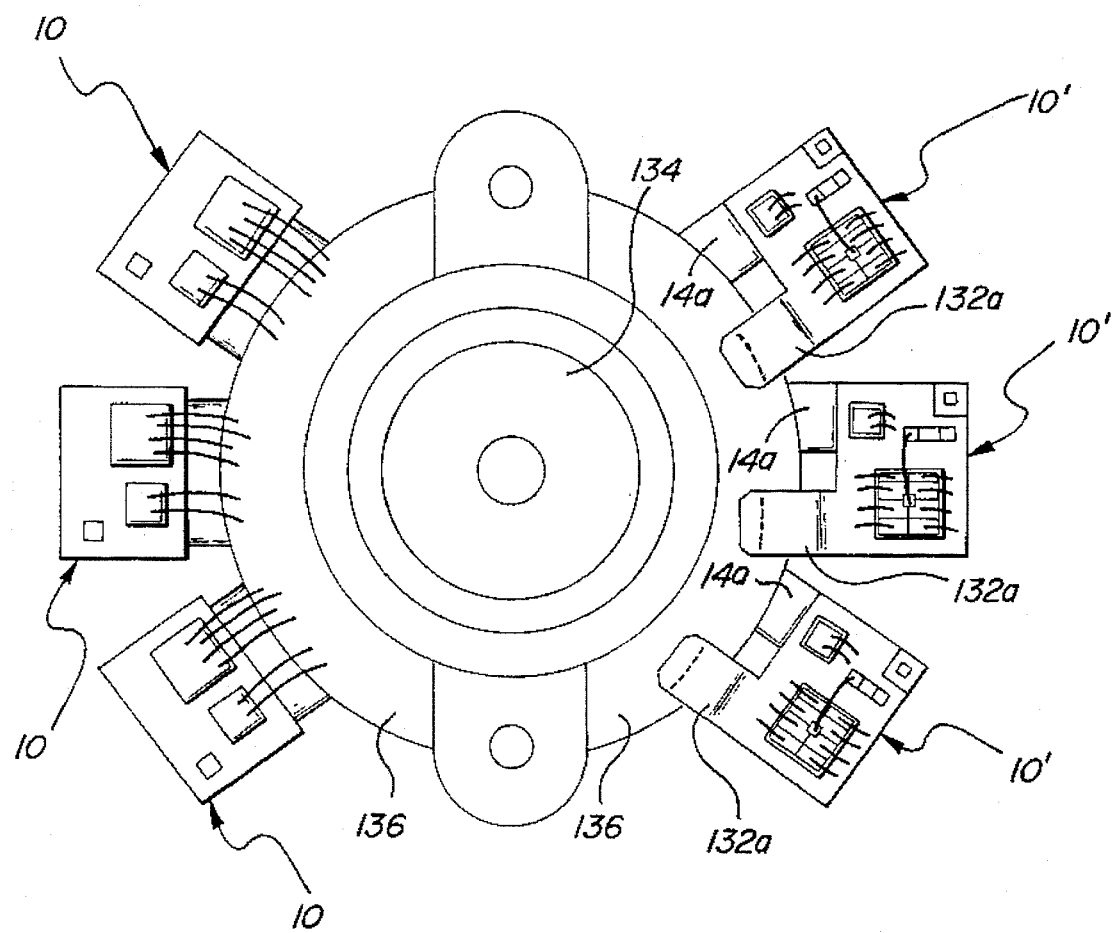
FIG. 23 schematically shows a comparative top plan view illustrating connections of the substrate subassemblies of FIGS. 1 and 21 to overlapped flanges of coaxial terminal members.

FIG. 23 shows a plan view comparison, such as is shown in section in FIG. 22. FIG. 23 shows coaxial terminals 134 and 136, which are analogous to the coaxial terminals 34 and 36 in FIGS. 6–13. It can be seen that the tabs 132a of the top copper foil layer 132 extend onto the flange of terminal 136. This provides better terminal connection than provided by the filamentary wires directly from the chips 18 to the flange on terminal 136, as shown to the left in FIG. 23. Tabs 14a extend to a flange (not shown in FIG. 23) extending from a center terminal 134, similar to FIG. 22 and to FIGS. 6–13.

FIG. 24 shows a five layer substrate subassembly 10" in which a significant portion of the lower copper layer 14 is left exposed along the left edge of the substrate subassembly. The exposed portion of copper foil layer 14 is designated by reference numeral 14b. Exposed copper foil area 14b contains the "wire bond" pad 22 and the trimmable resistor chip 32. The ceramic layer 130 (not shown in this view) has apertures in it analogous to apertures 130a and 130b of FIG. 21. The upper copper foil layer 132 is disposed on the ceramic layer 130. It has windows 132a and 132b in it that register with the windows in the ceramic layer, thereby exposing the metal copper layer 14 within these windows. As in FIG. 21, SFD chip 22 and transistor chip 18 are respectively soldered to the copper layer 14 exposed within these windows.

FIG. 24 also shows another difference from FIG. 21. FIG. 24 shows the tabs 14a and 132a extending from an edge in line with chips 22, rather than from beside that line. It should also be mentioned that tabs 14a and 132a can have portions that overlap, to help reduce inductance in these leads. The overlap of tabs 14a and 132a is not complete in this embodiment. It permits the ends of the tabs to be coplanar, as shown.

Reference is now made to FIG. 25 which shows still another embodiment of our five layer subassembly, which we indicate by reference numeral 10'''. In this embodiment, tabs 14a and 132a are shown bent upright, as they would normally be before assembly with either stepped or coplanar terminals. This substrate subassembly 10''' incorporates a further extension of the concept of FIG. 24. Surface area 14b of the middle copper foil layer 14 is widened further. It is made so wide that copper foil area 14b also accommodates transistor chip 18 and SFD chip 20. It is widened so much that ceramic layer 130 and copper foil layer 132 are merely stacked narrow bars along the edge of the copper foil layer 14 from which tab 14a extends. Hence there is no necessity for it to contain any apertures in either the upper copper layer 132 or the upper ceramic layer 130. Upper copper foil layer 132 is generally coextensive with the ceramic bar 130, except for tab 132a. An advantage of this latter embodiment is not just that a major portion 14b of the metal copper layer 14 is exposed for mounting of the chips 18, 20 and 32. They can be mounted in any convenient arrangement that makes wire bonding easier.

The FIG. 25 substrate subassembly 10''' also reduces the amount of material needed for the upper ceramic layer 130.

This reduction in materials volume, makes it even more practical to use beryllium oxide for layer 130. From a manufacturing convenience, standpoint we believe that the embodiment shown in FIG. 25 would be preferred. For example, it allows one to make contact with portions of chip 18 closest to tabs 14a and 132a, then make a wire bond between chip 32 and gate contact area 26 and then finish making wire bonds between upper copper foil 132 and the remaining transistor portions 24 on chip 18. Reducing the cost of layer 130, makes use of beryllium oxide more practical for this layer. This, in turn, makes the subassembly match silicon better. Using the same ceramic for both wafer 14 and layer 130 might offer some durability improvement as well, since the materials are similar.

It should also be mentioned that the five layer substrate subassembly embodiment shown in FIGS. 21, 24 and 25 do not include any perforations in tabs 14a and 132a to facilitate bending of these tabs during manufacturing. We believe that one can merely wipe the tabs onto the terminal surface to which they are going to be bonded. There will be little spring back of the tabs after such wiping. Then, a fixture can be placed on top of them to hold them against the terminal surface during bonding. If no holes are formed in tabs 14a or 132a, the full width of the tab can be used for conduction of current.

It is recognized that this invention has been described in connection with certain specific embodiments. On the other hand, it is understood that the basic principles of this invention can take the form of many other embodiments without departing from the spirit of this invention. It is intended that the claims not be limited to the precise embodiments herein disclosed, but only limited as expressly recited in the claims hereof.

We claim:

1. A high power module containing a high power semiconductor switching device, said module comprising:

a thermally conductive support plate having a given thermal expansion coefficient;

a high power semiconductor switching device composite substrate subassembly including a beryllium oxide wafer having first and second opposed major surfaces said opposed major surfaces being substantially completely metalized with copper foil and separated by edges of said wafer, said first metalized surface disposed on said support plate and in low resistance thermal and electrical contact therewith;

a high power semiconductor switching device chip in low resistance thermal and electrical contact with said second metalized surface, and forming an active component part of said composite substrate subassembly;

first and second terminal members disposed in close proximity to a given edge of said subassembly;

the second metalized surface having an integral tab that extends away from the wafer and connects with the first terminal member to establish a short low electrical resistance connection of a given impedance between a first region of said chip and the first terminal; and a ceramic layer on said second metalized surface adjacent said chip, such ceramic layer having an additional metalized surface with an integral tab that extends away from the wafer and connects with the second terminal member, and a second region of the chip is in low electrical resistance contact with said additional metalized surface.

2. A high power module containing a plurality of high power insulated gate switching transistors, said module comprising:

a housing having a thermally conductive support plate of a given thermal expansion coefficient;

a plurality of similar semiconductor switching transistor substrate subassemblies supported on said support plate in similar low thermal resistance relationship with said support plate;

each of said semiconductor switching transistor substrate subassemblies including a ceramic wafer having opposed major surfaces which are substantially completely metalized but spaced apart by said wafer;

each subassembly further including a switching transistor chip thermally and electrically conductively bonded to one of the metalized wafer surfaces, and an integral metal tab extending from that metalized surface, which tab is in low electrical resistance communication with a first active region of said switching transistor chip;

a first terminal member having at least a portion disposed in said housing, in substantially equal close proximity to each tab of each of said plurality of substrate subassemblies; and an electrically conductive bond directly between each said subassembly tab and said first terminal member that provides an electrical connection of essentially the same impedance between each of said subassemblies and said first terminal member.

3. The high power module of claim 2 in which each switching transistor chip is a high power and high frequency insulated gate bipolar transistor chip, and a second active region of each switching transistor chip is in low electrical resistance communication of essentially the same impedance with a second terminal member disposed in said housing.

4. The high power module of claim 3 where in each substrate subassembly, the ceramic wafer is of beryllium oxide, copper foil metalizes at least the wafer surface to which the switching transistor chip is bonded, the switching transistor chip is soldered to such copper foil, the subassembly tab is an integral extension of such copper foil, the resultant substrate subassembly has a coefficient of expansion close to that of silicon, and the housing support plate has a coefficient of expansion similar to that of the substrate subassembly.

5. The high power module of claim 3 in which the second terminal member is disposed in overlapping relationship to the first terminal member, and in each substrate subassembly, a beryllium oxide layer is bonded to a part of said metalized wafer surface to which the switching transistor chip is bonded, a copper foil layer is bonded to the beryllium oxide layer, an integral tab on said copper foil layer extends away from said substrate subassembly, filamentary metal wires interconnect said second active region on the switching transistor chip with said copper foil layer, and said tab on said copper foil layer is bonded to said second terminal member, whereby said wires and said tab provide a low resistance electrical connection between said second active region on said switching transistor chip and said second terminal member, a trimmable resistance unit on said subassembly, a low resistance electrical connection between a gate electrode on said switching transistor chip and a first terminal of said trimmable resistance unit, and a gate bus conductor connected to a second terminal of said trimmable resistance unit.

6. The high power module of claim 5 in which the first and second terminal members are coaxial.

7. The high power module of claim 5 in which the two terminal members have generally linear edges facing said substrate assemblies, the linear edges are closely spaced and parallel, and the terminal members overlap one another.

8. The high power module of claim 2 in which the first terminal member is generally cylindrical and the module further includes a second terminal member that is coaxial with the first terminal member, and a low electrical resistance connection between a given region on the surface of each of said switching transistor chips and said second terminal member.

9. The high power module of claim 2 in which the first terminal member is generally linear along an edge facing a generally parallel array of the plurality of substrate subassemblies and the module further includes a second terminal member that is also generally linear along an edge facing the generally parallel array of the plurality of substrate subassemblies, the generally linear edges are closely spaced and parallel so that the terminal members overlap one another, and a second active region of the switching transistor chip is in low electrical resistance contact with the second terminal member.

* * * * *